United States Patent
Mori et al.

(10) Patent No.: US 7,470,334 B2
(45) Date of Patent: Dec. 30, 2008

(54) METHOD FOR PREPARING SINTERED PRODUCT, SINTERED PRODUCT AND MAGNETOSTRICTION MATERIAL

(75) Inventors: Teruo Mori, Tokyo (JP); Takeshi Nomura, Tokyo (JP); Seigo Tokoro, Tokyo (JP); Naomichi Umehara, Tokyo (JP)

(73) Assignee: TDK Corporation, Tokyo (JP)

( * ) Notice: Subject to any disclaimer, the term of this patent is extended or adjusted under 35 U.S.C. 154(b) by 136 days.

(21) Appl. No.: 10/363,381

(22) PCT Filed: Feb. 7, 2002

(86) PCT No.: PCT/JP02/01032

§ 371 (c)(1),
(2), (4) Date: Feb. 27, 2003

(87) PCT Pub. No.: WO02/063052

PCT Pub. Date: Aug. 15, 2002

(65) Prior Publication Data

US 2003/0190250 A1    Oct. 9, 2003

(30) Foreign Application Priority Data

| Feb. 7, 2001 | (JP) | 2001-030743 |
| Jun. 21, 2001 | (JP) | 2001-188667 |
| Dec. 5, 2001 | (JP) | 2001-370960 |
| Dec. 5, 2001 | (JP) | 2001-371360 |

(51) Int. Cl.
*H01F 1/053* (2006.01)

(52) U.S. Cl. .................... 148/301; 148/103; 148/101

(58) Field of Classification Search .............. None
See application file for complete search history.

(56) References Cited

U.S. PATENT DOCUMENTS

| 3,970,484 | A |  | 7/1976 | Doser et al. ............. 148/103 |
| 4,152,178 | A | * | 5/1979 | Malekzadeh et al. ....... 148/103 |
| 4,308,474 | A | * | 12/1981 | Savage et al. .............. 310/26 |
| 5,110,376 | A | * | 5/1992 | Kobayashi et al. ......... 148/301 |
| 5,336,337 | A | * | 8/1994 | Funayama et al. ......... 148/301 |
| 5,527,398 | A | * | 6/1996 | Funayama et al. ......... 148/101 |

(Continued)

FOREIGN PATENT DOCUMENTS

EP          0 678 585          4/1995

(Continued)

OTHER PUBLICATIONS

Japanese language notice of allowance for corresponding Japanese application No. 2001-188667 lists the references above.

*Primary Examiner*—John P. Sheehan
(74) *Attorney, Agent, or Firm*—Hogan & Hartson LLP

(57) ABSTRACT

A method for manufacturing a sintered compact includes the steps of preparing an alloy powder having a composition represented by Expression 1: $RT_W$ (where, R is at least one kind of rare earth metal, T is at least one kind of transition metal, and w defines a relation of $1<w<4$), sintering the alloy powder in a vacuum atmosphere or an atmosphere containing gas with a molecular weight of 30 or less, and processing the alloy powder by a hot isostatic pressing. The sintered compact has a high density, and reduces deteriorations in its sintered compact properties such as magnetostrictive properties in an air atmosphere at high-temperatures.

13 Claims, 23 Drawing Sheets

U.S. PATENT DOCUMENTS

| | | | |
|---|---|---|---|
| 5,529,745 A * | 6/1996 | Mori et al. | 419/38 |
| 6,017,402 A * | 1/2000 | Sukigara et al. | 148/301 |
| 6,273,965 B1 * | 8/2001 | Pulvirenti et al. | 148/301 |
| 6,273,966 B1 * | 8/2001 | Snodgrass et al. | 148/301 |
| 6,312,530 B1 * | 11/2001 | Kojima et al. | 148/301 |
| 6,451,131 B1 * | 9/2002 | Tai et al. | 148/301 |

FOREIGN PATENT DOCUMENTS

| | | |
|---|---|---|
| EP | 0 678 585 A1 | 4/1995 |
| JP | 61-059811 | 3/1986 |
| JP | 62-222004 | 9/1987 |
| JP | 63-050721 | 3/1988 |
| JP | 63262803 | 10/1988 |
| JP | 02-030737 | 2/1990 |
| JP | 02121376 | 5/1990 |
| JP | 04-362159 | 12/1992 |
| JP | 06136489 | 5/1994 |
| JP | 07-286249 | 10/1995 |
| JP | 08020806 | 1/1996 |
| JP | 09237708 | 9/1997 |
| JP | 2000178611 | 6/2000 |

* cited by examiner

METHOD FOR PREPARING SINTERED PRODUCT, SINTERED PRODUCT AND MAGNETOSTRICTION MATERIAL

TECHNICAL FIELD

The present invention relates to a manufacturing method that yield high density sintered compacts, sintered compacts with high density that can be manufactured according to the manufacturing method, and to magnetostrictive materials with superior magnetostrictive properties and ideal for use on transducers between magnetic energy and mechanical energy.

BACKGROUND

When a ferromagnetic compact is magnetized, its dimensions change; this phenomenon is called magnetostriction, and materials that cause this phenomenon are called magnetostrictive materials. The saturation magnetostrictive constant, which is the saturation change amount caused by magnetostriction, generally has the value of $10^{-5}$-$10^{-6}$, and magnetostrictive materials with large saturation magnetostrictive constants are widely used in oscillators, filters and sensors.

At present, magnetostrictive materials with even larger magnetostriction values are demanded, and among the materials proposed are compounds made of rare earth (R) and iron (Fe). R and Fe form $RFe_2$ Laves-type intermetallic compounds, and although the magnetostriction value of $RFe_2$ Laves-type intermetallic compounds is large when the external magnetic field is large, it is insufficient when the external magnetic field is small. Consequently, a magnetostrictive material having an even larger magnetostriction value is in demand among $RFe_2$ Laves-type intermetallic compounds.

As one technique to obtain a larger magnetostriction value for a magnetostrictive material, the density of sintered compact may be increased when the sintered compact is manufactured using the powder metallurgical method. The powder metallurgical method involves heating metal or alloy powder to high temperature and sintering the same, and it is a method to manufacture sintered compacts of magnetostrictive material having predetermined shapes. It is suitable for mass production and offers an advantage of being able to produce a variety of shapes with high yield.

However, the magnetostrictive material manufactured through the powder metallurgical method has gaps among powder particles in the magnetostrictive material and the gaps remain and become pores after sintering, and this phenomenon impede the manufacture of a high density sintered compact. After using the material containing pores as a magnetostrictor for a long time, these pores lead to dry corrosion of the rare earth metal, which oxidizes, especially at high temperature in atmospheric air, and the magnetostrictive properties diminish with these changes.

One way proposed to reduce the number of pores in order to manufacture sintered compacts made of high density magnetostrictors is, for example, (1) to use an argon (Ar) gas atmosphere to sinter when manufacturing a supermagnetostrictor represented by $RT_2$ using the powder metallurgical method (Croat, J. J. "Liquid Sintering of Rare Earth-Iron ($Dy_{0.7}Tb_{0.3}Fe_2$) Magnetostrictive Materials." J. Appl. Phys. 49.3 (1978)). Also, (2) there has been proposed a method for manufacturing a magnetostrictive material in which several types of raw material powders obtained through machine grinding are sintered in an Ar gas atmosphere, in order to align the crystal orientation of the powders in a compaction process in magnetic field (see Japanese laid-open unexamined Patent Application H 7-286249). Similarly, (3) another manufacturing method proposed is a method for manufacturing a magnetostrictive material in which raw material powder that is composed of plural kinds of raw materials including hydrides of some of the raw materials is sintered in an Ar gas atmosphere.

However, the manufacturing method proposed by Croat yields only about 86% density, which is low, in the sintered compact. Further, even with the method for manufacturing a magnetostrictive material according to the method described in Japanese laid-open unexamined Patent Application H 7-286249, the density of the sintered compact formed from the magnetostrictive material is also low at only about 86%. Moreover, the density of the sintered compact obtained through the manufacturing method described above that uses several types of raw material powders also yields a low density of about 88-93%.

In terms of magnet materials, the following has been proposed: (4) permanent magnets with high coercive force that are manufactured by plastically forming a R—Fe—B system magnet material with a hot press (see Japanese laid-open unexamined Patent Application S 62-202506); (5) anisotropic magnetic powder in which a superplastic metal powder and a pyrolytic binder are added to an anisotropic magnetic powder to form a mixture, the mixture is oriented by a magnetic field, the binder is eliminated through pyrolysis, and the rest is subject to main sintering and hot isostatic pressing (hereinafter called "HIP") (see Japanese laid-open unexamined Patent Application H 6-192709); and (6) R—Fe—B system permanent magnets, in which permanent magnets are formed by compacting raw material powders through compaction pressure and directly circulating electric current; and raw material powder for permanent magnets that can be compacted to have a high density, which are manufactured by applying relatively a low pressure by means of hot pressing or HIP to the raw material powder (see Japanese laid-open unexamined Patent Application H 10-189319).

However, because the manufacturing methods described above involve sintering in Ar gas, which is an inert gas, the Ar gas fills the closed pores inside the sintered compacts, and when the sintered compacts are HIP-treated and compressed, the internal pressure caused by the Ar gas inside the closed pores leads to a strain; when these methods are applied to magnetostrictive materials, the strain lowers magnetic properties such as magnetostriction value.

Another technique to increase the magnetostriction value of magnetostrictive material involves orienting an $RFe_2$ Laves-type intermetallic compound manufactured under the powder metallurgical method in the direction of a [111] axis, which is an easy axis of magnetization and which provides a large magnetostrictive constant, to thereby obtain a magnetostrictive material whose magnetostriction value is large even when the external magnetic field is small and that has good magnetic field responsiveness.

For example, (7) among the conventional magnetostrictive materials in which crystals are oriented are magnetostrictive materials manufactured through the single crystal method. In addition, there has been proposed (8) a magnetostrictive material oriented along a [111] axis through the powder metallurgical method in which a $Tb_{0.3}Dy_{0.7}Fe_{2.0}$ powder is compacted in a magnetic field and subsequently sintered (see U.S. Pat. No. 4,152,178). Furthermore, there has been proposed (9) an alloy of Dy, Tb and Fe in which particles of $Fe_2Tb$ and $Fe_2Dy$ are compacted in a magnetic field into a compression compact and sintered (see Japanese laid-open unexamined Patent Application H 1-180943). Moreover, there is also proposed (10) a magnetostrictive material in which a rare earth-iron with Mn added thereto is used as a basis and the magnetostrictive material is grown in a [110] axis orientation, which is an easy axis orientation for crystals to grow (see Japanese laid-open unexamined Patent Application H 5-148594).

Also, another proposed method relates to (11) a method to manufacture a magnetostrictive sintered compact, in which $RFe_2$ powder and powder of R and Fe eutectic composition that is adjusted using the gas atomizing method or rotating electrode method are mixed, finely ground, compacted in a magnetic field and sintered (see Japanese laid-open unexamined Patent Application H 6-256912). Further, a conventional technology that involves finely grinding with a vibrating mill and sintering is known as a way to achieve high density in a sintered compact.

However, the single crystal method such as the method (7) described above, whether using the zone melting method or the Bridgman method, requires casting the raw material after melting it to form a cast ingot, making a single crystal using the cast ingot, annealing and machining; consequently, its productivity is low and because its shape is limited to a cylindrical shape it requires cutting and other machining to make it into articles. An additional problem with the single crystal method, particularly when using the Bridgman method, is that the single crystal fails to be oriented in the direction of the [111] axis. And the aforementioned method (8) described in U.S. Pat. No. 4,152,178 has a problem of requiring a large magnetic field for orientation to take place due to the fact that the crystal magnetic anisotropy of $Tb_{0.3}Dy_{0.7}Fe_{2.0}$ is small. Further, the alloy proposed in the aforementioned method (9) described in Japanese laid-open unexamined Patent Application H 1-180943 entails a problem of the constituent metal compounds failing to orient themselves in the direction of the [111] axis, since the easy axis of magnetization for $Fe_2Tb$ is the [111] axis, while for $Fe_2Dy$ it is the [100] axis. Also, in the aforementioned method (10) described in Japanese laid-open unexamined Patent Application H 5-148594, due to the fact that the crystal grows in the direction of the [110] axis, the magnetostrictive material requires cutting and other machining in order to obtain a magnetostrictive material oriented in the [111] axis, which is an easy axis of magnetization and provides the largest magnetostrictive constant. Further, with the powder obtained through the gas atomizing method in the aforementioned method (11) described in Japanese laid-open unexamined Patent Application H 6-256912 or the powder obtained through the use of a vibrating mill described above, there is a problem in that the sintering density is not necessarily sufficient for obtaining high magnetostrictive properties even though the sintering density is increased.

Furthermore, alloys comprising $RFe_2$ Laves-type intermetallic compounds as described above sometimes precipitate, depending on the alloy composition and/or manufacturing conditions, heterogeneous phases such as phases represented by $RFe_3$, for example, and/or phases formed by impurities in raw material, such as oxides or carbides, in addition to the main phase $RFe_2$. These heterogeneous phases affect the magnetostrictive properties of $RFe_2$ Laves-type intermetallic compounds. Consequently, the precipitation of heterogeneous phases must be controlled in order to obtain superior magnetostrictive properties and to prevent fluctuations in the properties among products, i.e., magnetostrictive materials.

A "super magnetostrictive alloy" described in Japanese laid-open unexamined Patent Application H 5-148594 is an alloy of Fe and R that has been partially replaced with Mn and other metals, and is an alloy containing 5 vol. % or less of the $RFe_3$ phase, which is a heterogeneous phase. By controlling the alloy composition in the super magnetostrictive alloy, the precipitation of the $RFe_3$ phase is restricted and the magnetostrictive properties of the alloy are improved.

However, the aforementioned Japanese laid-open unexamined Patent Application H 5-148594 provides no consideration as to systems in which the amount of rare earth metal represented by R is increased in the alloy composition. Accordingly, it is necessary to study such compositions and find the optimum range.

DISCLOSURE OF INVENTION

The present invention was conceived in view of the above problems, and its object is to provide a method for manufacturing a fine sintered compact with high density. In addition, another object is to provide a method for manufacturing a sintered compact with little internal strain, which results from closed pores with low internal pressure.

Furthermore, in accordance with a further object, by using these manufacturing methods for fine sintered compacts with high density, the present invention provides magnetostrictive materials with large magnetostriction values, small reduction in magnetostriction value over time, and without cracks. Moreover, it is another object to provide a superior magnetostrictive material in which the crystal orientation is aligned to gain a large magnetostriction value, the precipitation of heterogeneous phases is controlled to prevent change in properties among products, and that has high productivity.

To solve the problems described above, the present invention recited in claim 1 pertains to a method for manufacturing a sintered compact includes the step of sintering in a mixed atmosphere of hydrogen gas and inert gas an alloy powder having a composition represented by Expression 1: $RT_W$ (where, R is at least one kind of rare earth metal, T is at least one kind of transition metal, and w defines a range of 1<w<4).

In accordance with the present invention recited in claim 2, in the method for manufacturing a sintered compact recited in claim 1, the mixed atmosphere may be an atmosphere in a temperature heating process that is conducted at 650° C. or higher and/or in a stable temperature state that is conducted in a range from 1150° C. to 1230° C., containing hydrogen gas and argon (Ar) gas represented by Expression 2: Hydrogen gas:Argon (Ar) gas=X:100−X, wherein X (vol. %) is 0<X<50.

The present invention recited in claim 3 pertains to an alloy powder having a composition represented by Expression 1: $RT_W$ (where, R is at least one kind of rare earth metal, T is at least one kind of transition metal, and w defines a range of 1<w<4), which is sintered in a vacuum atmosphere or an atmosphere containing gas with a molecular weight of 30 or less, and processed by a hot isostatic pressing.

In accordance with the present invention recited in claim 4, in the method for manufacturing a sintered compact recited in claim 3, an average grain size of the alloy powder may be in a range from 10 μm to 30 μm.

In accordance with the present invention recited in claim 5, in the method for manufacturing a sintered compact recited in claim 3 or claim 4, the atmosphere at the time of sintering may contain at least one gas selected from He gas, Ne gas and hydrogen gas.

In accordance with the present invention recited in claim 6, in the method for manufacturing a sintered compact recited in any one of claim 3 through claim 5, the atmosphere during the hot isostatic pressing process may be a vacuum.

In accordance with the present invention recited in claim 7, in the method for manufacturing a sintered compact recited in any one of claim 3 through claim 6, the atmosphere during the sintering in the temperature heating process that is conducted at 600° C. or higher or in the stable temperature state may be an atmosphere containing hydrogen gas and argon (Ar) gas represented by Expression 3: Hydrogen gas:Argon (Ar) gas=Y:100−Y, wherein Y (vol. %) is Y>50.

In accordance with the present invention recited in claim 8, the method for manufacturing a sintered compact recited in any one of claim 3 through claim 7 may further include the step of annealing the alloy powder in an Ar gas atmosphere that is conducted in a range from 1150° C. to 1230° C., after the sintering and the hot isostatic pressing process.

In accordance with the present invention recited in claim 9, in the method for manufacturing a sintered compact recited in any one of claim 3 through claim 8, the sintered compact may have a relative density of 98% or greater.

In accordance with the present invention recited in claim 10, in the method for manufacturing a sintered compact recited in any one of claim 1 through claim 9, R may be at least one rare earth metal selected from the group consisting of Nd, Pr, Sm, Tb, Dy and Ho.

In accordance with the present invention recited in claim 11, in the method for manufacturing a sintered compact recited in claim 10, R may be composed of Tb and Dy.

In accordance with the present invention recited in claim 12, in the method for manufacturing a sintered compact recited in claim 11, R may have a composition that is represented by Expression 4: $Tb_v Dy_{1-v}$, where v is in a range of $0.27 \leq v \leq 0.50$.

In accordance with the present invention recited in claim 13, in the method for manufacturing a sintered compact recited in any one of claim 1 through claim 12, T may be at least one element selected from Fe, Co and Ni.

The present invention recited in claim 14 pertains to a magnetostrictive material that is represented by Expression 5: $RT_W$ (where, R is at least one kind of rare earth metal, T is at least one kind of transition metal, and w defines a relation of $1.50 \leq w \leq 2.30$) may be formed by compaction in a magnetic field, wherein the magnetostrictive material has a degree of orientation of a [111] axis in a direction in parallel with the magnetic field given by Formula (1):

$$\text{Degree of orientation} = \frac{I(222)(//)/I(311)(//)}{I(222)(\perp)/I(311)(\perp)}, \quad \text{Formula (1)}$$

which is 2.0 or greater (where, each of the I (222) and I (311) represents an x-ray diffraction intensity on a (222) plane and a (311) plane, respectively, and (//) and (⊥) represent measurements taken on a plane parallel and on a plane vertical, respectively, with respect to a magnetic field orientation in the compaction in magnetic field).

In accordance with the present invention recited in claim 15, in the magnetostrictive material recited in claim 14, the degree of orientation of the magnetostrictive material in which the [111] axis orients in a direction in parallel with the magnetic field may have a value of 7.0 or greater given by Formula (1).

The present invention recited in claim 16 pertains to a magnetostrictive material that is represented by Expression 5: $RT_W$ (where, R is at least one kind of rare earth metal, T is at least one kind of transition metal, and w defines a range of $1.50 \leq w \leq 2.30$), which is formed by compaction in a magnetic field, the magnetostrictive material having a structure composed of a $RT_2$ main phase and at least one kind of heterogeneous phase including a phase having R as a main composition.

In accordance with the present invention recited in claim 17, in the magnetostrictive material recited in claim 16, the ratio of the phase having R as a main composition among the heterogeneous phase to the $RT_2$ main phase ([R]/[$RT_2$]) may be in a range of $0<[R]/[RT_2] \leq 0.45$.

In accordance with the present invention recited in claim 18, in the magnetostrictive material recited in any of claim 14 through claim 17, the magnetostrictive material may be represented by Expression 6: $(Tb_v Dy_{1-v})T_w$ (where, v and w are atom ratios wherein v and w are in ranges of $0.27 \leq v \leq 0.50$ and $1.50 \leq w \leq 2.30$, respectively.)

In accordance with the present invention recited in claim 19, in the magnetostrictive material recited in any of claim 14 through claim 18, T in the magnetostrictive material may be at least one kind of metal selected from Fe, Ni and Co.

In accordance with the present invention recited in claim 20, in the magnetostrictive material recited in any of claim 14 through claim 19, the magnetostrictive material may be formed by compacting in a magnetic field and then sintering a mixture containing a material A that is represented by Expression 7: $(Tb_x Dy_{1-x})T_y$ (where, x and y are atom ratios wherein x and y are in ranges of $0.35<x \leq 0.50$ and $1.50 \leq y \leq 2.30$, respectively), a material B that is represented by Expression 8: $Dy_t T_{1-t}$ (where, Dy may include at least one of Tb and Ho, and t is an atom ratio in a rage of $0.37 \leq t \leq 1.00$), and a material C containing T.

In accordance with the present invention recited in claim 21, in the magnetostrictive material recited in claim 20, the material B represented by Expression 8 in the magnetostrictive material contains hydrogen in the amount of 7,000 ppm or greater but 22,000 ppm or lower.

BEST MODE FOR CARRYING OUT THE INVENTION

Figure 1:
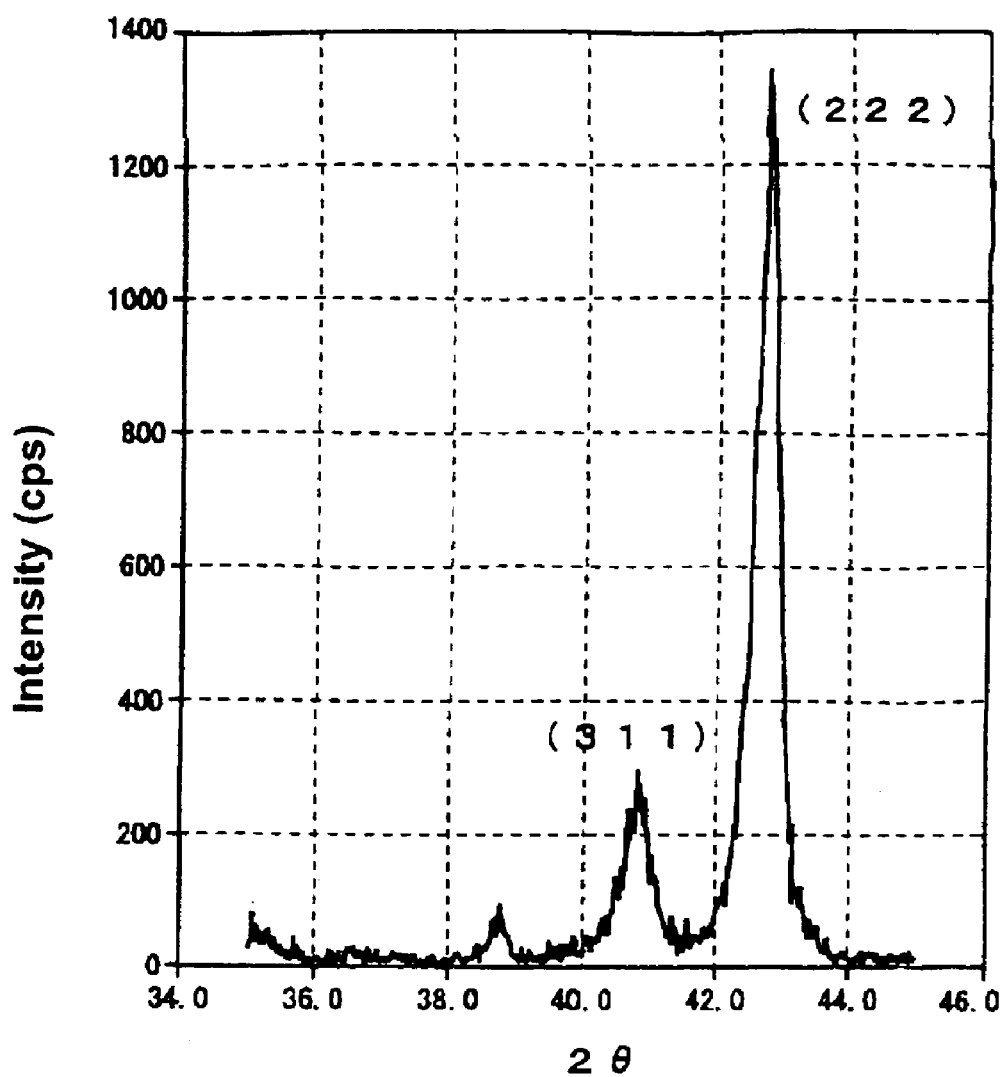
FIG. 1 is an x-ray diffraction graph of a plane parallel to a direction in which a magnetostrictive material in accordance with the present invention is formed by compaction in magnetic field.

Embodiments of the present invention are described in detail below.

A first method for manufacturing sintered compacts in accordance with an embodiment of the present invention involves sintering alloy powders having a composition represented by Expression 1: $RT_w$ (where R is one or more types of rare earth metals, T is one or more types of transition metals, and w is $1<w<4$).

Here, R represents one or more types of rare earth metals selected from among lanthanoid series and actinoid series, and Y. Of these, rare earth metals Nd, Pr, Sm, Tb, Dy and Ho are preferable as R, and Tb and Dy are particularly preferable. This is due to the fact that each of the $RT_2$ Laves-type intermetallic compounds formed by Tb and/or Dy has a high Curie temperature and a large magnetostriction value. In addition, R may be a mixture of these rare earth metals.

T represents one or more types of transition metals. Of these, transition metals Fe, Co, Ni, Mn, Cr and Mo are preferable as T, and Fe, Co and Ni are particularly preferable; these metals may be combined for use.

In alloys represented by Expression 1: $RT_w$, w is $1<w<4$. Each of the $RT_2$ Laves-type intermetallic compounds formed by R and T in which w=2 in Expression 1 has a high Curie temperature and a large magnetostriction value, and therefore is suitable as a magnetostrictor. When w is 1 or less, an RT phase would precipitate in the heat treatment after sintering and the magnetostriction value would fall. When w is 4 or higher, there would be more $RT_3$ phase or $RT_5$ phase, which would reduce the magnetostriction value. Consequently, w in the range of $1<w<4$ is ideal to obtain phases rich in $RT_2$.

R may be a mixture of rare earth metals, and a mixture of Tb and Dy is particularly favorable. Further, in alloys represented by Expression 4: $Tb_vDy_{1-v}$, it is preferable that v is in the range of $0.27 \leq v \leq 0.5$. With this, each of the alloys $(Tb_v Dy_{1-v})T_w$ having a large saturation magnetostrictive constant and a large magnetostriction value can be obtained. When v is less than 0.27, sufficient magnetostriction values cannot be obtained in a temperature range lower than room temperature, and when v is more than 0.50, sufficient magnetostriction value cannot be obtained in room temperature range.

Fe is particularly preferable as T, and Fe can form a (Tb, Dy) $Fe_2$ intermetallic compound with Tb and Dy, which would yield a sintered compact having a high magnetostriction value and high magnetostrictive properties. Part of Fe may be replaced with Co or Ni. When these replace part of Fe, Co increases magnetic anisotropy but reduces magnetic permeability, while Ni lowers the Curie temperature, and both consequently reduce the magnetostriction value in a condition of room temperature and high magnetic field; thus, Fe should constitute 70 wt. % or more, and preferably 80 wt. % or more.

In addition, it is preferable in the first method for manufacturing sintered compact to contain as part of the alloy powder a raw material that can be treated to absorb hydrogen. Having the alloy powder absorb hydrogen causes strain, and the internal stress of the strain leads to cracks. Consequently, pressure is applied on the mixed alloy powder when forming a green compact, and the metal alloy powder becomes ground internally in a mixed state and becomes a fine powder, so that when sintered it can yield a fine and high density sintered compact. Furthermore, rare earths Tb and Dy are easily oxidized and form on their surfaces oxide films with a high melting point, which restrict progress in sintering, in the presence of even a small amount of oxygen, but Tb and Dy become more difficult to be oxidized when they absorb hydrogen. As a result, a high density sintered compact can be manufactured by hydrogen absorbing part of the alloy powder.

The first method for manufacturing sintered compact involves sintering the raw material powder of the alloy represented by $RT_w$ in a temperature zone of 650° C. or higher during a temperature heating process and/or a stable temperature zone of between 1150° C. and 1230° C., and in a mixed atmosphere of hydrogen gas and inert gas.

Sintering is conducted by raising the temperature of the compacted raw material powder inside an oven for heat treatment. The rate for heating temperature is 3-20° C./minute. Rates lower than 3° C./minute lead to low productivity, and rates higher than 20° C./minute cause the temperature of the compacted raw material powder inside the oven to be uneven, which causes segregations and heterogeneous phases to appear. The temperature heating process should be at 650° C. or higher to prevent oxidation caused by a minuscule amount of residual oxygen.

Sintering is also conducted at a stable temperature in which the temperature is maintained at a virtually constant temperature level. The preferable stable temperature is in the range of 1150° C. to 1230° C. When the stable temperature is less than 1150° C., a long time is required to remove internal strains and therefore not efficient, while when the stable temperature is higher than 1230° C., the sintered compact can fuse since the temperature approaches the melting point of the alloy represented by $RT_w$ and heterogeneous phases such as $RT_3$ phase can precipitate.

The atmosphere preferable for sintering is a mixed atmosphere of hydrogen gas and an inert gas. R reacts extremely easily with oxygen and forms a stable rare earth oxide. Such an oxide has low magnetism but does not indicate magnetic properties that would make it a practical magnetic material. Since even a small amount of oxygen can drastically reduce the magnetic properties of a sintered compact in high temperature sintering, an atmosphere containing hydrogen gas is especially preferable for heat treatments such as sintering. An atmosphere that prevents oxidation is an inert gas atmosphere, but an inert gas alone cannot completely remove oxygen and rare earth metals with high reactivity with oxygen form oxides in such an atmosphere; consequently, a mixed atmosphere of hydrogen gas and inert gas is preferable to prevent such oxidation.

A mixed atmosphere of hydrogen gas and inert gas is preferably as represented by Expression 2: hydrogen gas: argon (Ar) gas=X:100−X, where X (vol. %) is 0<X<50. Ar gas is an inert gas that does not oxidize R, and it therefore mixes with hydrogen gas to create an atmosphere having a reduction action. In order to obtain the reduction action, X (vol. %) should be at least 0<X. Further, since the reduction action becomes saturated when X (vol. %) is 50≦X, X<50 is preferable.

It is further preferable for the mixed atmosphere of hydrogen gas and Ar gas to be in a temperature zone of 650° C. during temperature heating process or to be in a stable temperature zone.

A second method for manufacturing sintered compacts in accordance with an embodiment of the present invention involves sintering alloy powders having a composition represented by Expression 1: $RT_w$ (where R is one or more types of rare earth metals, T is one or more types of transition metals, and w is 1<w<4) in vacuum atmosphere or in an atmosphere containing a gas whose molecular weight is 30 or less, and conducting an HIP treatment.

The description concerning alloys represented by Expression 1: $RT_w$ is the same as the one for the first method for manufacturing sintered compacts and is therefore omitted here.

The average particle size of the alloy powders represented by $RT_w$ should be between 10 μm and 30 μm, and preferably between 20 μm and 30 μm. In normal sintering that takes place in an atmosphere of inert gas such as Ar or nitrogen, each of the alloy powders whose average particle size is 10 μm or greater has small surface energy due to its large particle size and normally has difficulties making progress in sintering even when heat treated and also has difficulties in attaining high density, but with HIP treatment it can make progress in sintering even when its average particle size is large. When the average particle size is less than 10 μm the surface area becomes large, the powder oxidizes when ground and forms an oxide film on the surface of the powder; this impedes the powder from making progress in sintering so that the density of the sintered compact fails to increase. When the average particle size exceeds 30 μm, the small surface energy makes it difficult for the powder to make progress in sintering, so that the density of the sintered compact fails to increase and the failure of the sintering to progress causes an increased number of open and closed pores to develop inside.

The heat treatment conditions for sintering are temperature of between 1150° C. and 1230° C. and heat treatment time of one to ten hours. At temperatures lower than 1150° C., there is insufficient crystal growth of the sintered compact, and at over 1230° C., the sintered compact turns into a fused state.

The atmosphere for sintering is preferably a vacuum atmosphere or an atmosphere containing a gas, particularly hydrogen gas or an inert gas such as Ne or He, whose molecular weight is 30 or less. By sintering in a vacuum atmosphere, the oxidation of alloy powder can be prevented. Even when there are closed pores, no internal pressure develops since there is no residual gas in the closed pores, and this prevents the magnetostriction value from falling.

Additionally, in an atmosphere containing a gas with low molecular weight, particularly an inert gas such as Ne or He whose molecular weight is 30 or less, oxidation of the alloy powder can be prevented. Low molecular weight gases such as Ne and He can be dissipated outside the sintered compact through the grain boundary of the sintered compact even when the gases fill the closed pores.

And in an atmosphere containing hydrogen, the sintered compact does not form any oxide films due to the reduction action of the hydrogen. In addition, hydrogen is absorbed by the alloy represented by Expression 1: $RT_w$, so that it becomes easy for hydrogen to penetrate inside or to form hydrides. As a result of this, even when there is residual hydrogen in closed pores the hydrogen travels as it forms hydrides and ultimately reaches the exterior surface of the sintered compact and becomes dissipated outside. Consequently, hydrogen gas in the atmosphere does not remain as a residue in closed pores that form inside the sintered compact.

The atmosphere favorable for heat treatment when the temperature reaches 600° C. or higher during the temperature heating process or when the stable temperature is 1100° C. or higher is a mixed gas atmosphere of hydrogen and Ar represented by Expression 3: hydrogen:Ar=Y:100−Y, where Y is Y>50 (vol. %). Because Ar's molecular weight is 39, which is over 30, it is difficult for Ar to pass through the grain boundary and the body of the sintered compact. However, when hydrogen constitutes 50 vol. % or more, even when the atmosphere's mixed gas remains as a residue in closed pores hydrogen dissipates and vanishes so that it does not remain as a residue in the closed pores inside; consequently, there is no strain caused by internal stress and the magnetostriction value of the magnetostrictive material obtained is not diminished. As a result, gases such as He, Ne or hydrogen that dissipate outside can be used to form a mixed gas with Ar. A mixed gas containing hydrogen is especially favorable. This is due to the fact that hydrogen has a fast dissipation speed.

The reason for using a mixed gas atmosphere having a hydrogen and Ar composition as described above for heat treatment when the temperature reaches 600° C. or higher during the temperature heating process or when the stable temperature is 1100° C. or higher is to create an agreeable condition for sintering to proceed as the R and T metals of the alloy represented by $RT_w$ soften and the powder particles begin to elastically deform, as well as to prevent oxidation by a minuscule amount of residual oxygen. The amount of hydrogen contained in the sintered compact should be 2500 wt. ppm at most, and preferably 2000 wt. ppm or less. When an oxide film forms on the surface of the alloy powder due to oxidation, sintering is hindered and the density of the sintered compact fails to increase. In addition, oxygen becomes dispersed inside the magnetostrictive material to make the material an impurity-dispersed material, which decreases its magnetic properties such as magnetostriction value and magnetic permeability.

Further in the second method for manufacturing a sintered compact, an HIP treatment is conducted after sintering. In order to apply an isostatic pressure, an HIP apparatus is used. In the HIP treatment, a pressure is applied equally from all directions. By applying an isostatic pressure, the density of the sintered compact can be increased and the number of closed and open pores inside the sintered compact can be reduced. In addition, the density inside the sintered compact can be made uniform.

Furthermore, the HIP treatment may be conducted in vacuum. By performing this treatment in vacuum, oxidation of the alloy powder is prevented. Moreover, compared to applying a pressure from one direction, applying an isostatic pressure in vacuum makes the movement of Ne, hydrogen and other similar atoms easier, and this results in a higher density and finer sintered compact.

The second method for manufacturing a sintered compact achieves a relative density of 98% or more for the sintered compact as a result of the HIP treatment described above. When the relative density is less than 98%, the proportion of closed and open pores is higher, which causes dry corrosion of R to develop and therefore oxidation, which in turn causes magnetic properties such as magnetostriction value to fall after a long term use. Furthermore, when the relative density is low and there are numerous pores, stress caused by a long term use leads to cracks. The relative density of the sintered compact should be 98% or more in order to prevent these from occurring.

It is preferable to anneal in an Ar gas atmosphere at a temperature between 1150° C. and 1230° C. after sintering and HIP treatment. This is to remove internal strains in the sintered compact that were caused by the HIP treatment. At temperatures under 1150° C., a long time is required to remove internal strains and therefore the anneal treatment is not efficient. At temperatures over 1230° C., the sintered compact can fuse since the temperature approaches the melting point of the alloy represented by Expression 1: $RT_w$ and other phases such as $RT_3$ phase can precipitate. And when a gas in the atmosphere used during sintering or a gas generated from decomposition of components of the sintered compact fills the closed pores, the compression that takes place during the HIP treatment reduces the volume of the closed pores, while at the same time the gas pressure increases. When the sintered compact is then heated in annealing, gas expands and can cause cracks to develop on the sintered compact. However, by using gases whose molecular weights are in each case 30 or less according to the present invention, no gases from sintering remain as residue, so that no cracks result from annealing and internal strains can be removed. Further, by removing internal strains, magnetic properties such as magnetostriction value can be improved.

Next, the magnetostrictive materials according to the present invention are represented by Expression 5: $RT_w$. Here, R includes one or more types of rare earth metals selected from among lanthanoid series and actinoid series, and Y. Of these, rare earth metals Nd, Pr, Sm, Tb, Dy and Ho are preferable as R, and Tb and Dy are particularly preferable. These rare earth metals may be used mixed.

T represents at least one type of metal selected from among Fe, Co and Ni. In addition, transition metals that form alloys with a rare earth metal R may be included in T. A list of transition metals specifically includes Mn, Cr, Mo and W.

In Expression 5, w represents atomic ratio and is $1.50 \leq w \leq 2.30$. Each of the $RT_2$ Laves-type intermetallic compounds formed when w=2 in $RT_w$ has a high Curie temperature and a large magnetostriction value, and therefore is suitable as a magnetostrictive material. In order to form an alloy whose main phase is $RT_2$, w should be in the range described above. In compositions in which w is less than 1.50, phases whose primary component is R become abundant, which causes a drastic decrease in magnetostriction value, while in compositions in which w is more than 2.30, phases rich in T such as $RT_3$ become abundant, which causes a decrease in magnetostriction value; consequently neither is favorable.

The magnetostrictive materials according to the present invention and represented by Expression 5: $RT_w$ more preferably contain Tb and Dy as R and are magnetostrictive materials represented by Expression 6: $(Tb_v Dy_{1-v}) T_w$. Here, T is at least one type of metal selected from among Fe, Co and Ni, as described above. Fe is especially preferable since it forms with Tb and Dy a (Tb, Dy) $Fe_2$ intermetallic compound that has high magnetostrictive properties. Part of Fe may be replaced with Co or Ni, but Co increases magnetic anisotropy while reducing magnetic permeability, while Ni lowers the Curie temperature, and both consequently reduce the magnetostriction value in a condition of room temperature and high magnetic field; thus, Fe should constitute 70 wt. % or more, and preferably 80 wt. % or more. In addition, T may include a transition metal that forms an alloy with rare earth metals Tb, Dy or Ho. A list of transition metals specifically includes Mn, Cr, Mo and W.

In Expression 5, w is $1.50 \leq w \leq 2.30$, as described earlier, and v is $0.27 \leq v \leq 0.5$. When v is less than 0.27, sufficient magnetostriction value cannot be obtained in a temperature range lower than room temperature, and when v is more than 0.50, sufficient magnetostriction value cannot be obtained in room temperature range.

Each of the magnetostrictive materials according to the present invention has the composition described above and its degree of orientation in a [111] axis is 2.0 or more as a value of formula (1):

$$\text{Degree of orientation} = \frac{I(222)(//)/I(311)(//)}{I(222)(\perp)/I(311)(\perp)}, \quad \text{Formula (1)}$$

Here, each of the I (222) and I (311) represents x-ray diffraction intensity on a (222) plane and a (311) plane, respectively, and (//) and ($\perp$) represent measurements taken on a plane parallel and on a plane vertical, respectively, to the direction of a magnetic field when conducting compaction in magnetic field.

Each of the magnetostrictive materials according to the present invention is a Laves-type intermetallic compound whose easy axis of magnetization is a [111] axis direction and whose magnetostrictive constant is largest in the [111] axis direction. Accordingly, the magnetostrictive material is oriented in a direction parallel to the magnetic field in the compaction process conducted in a magnetic field, and has the degree of orientation being 2.0 or more.

The degree of orientation is obtained by measuring the x-ray intensity diffracted on a (222) plane, where the x-ray diffraction is strongest, and on a (311) plane, where the impact from the measurement noise is small, and expressed as a ratio of the two.

FIG. 1 is a graph of x-ray diffraction measured on a plane parallel to a direction in which a magnetostrictive material according to the present invention is formed by compaction in a magnetic field. The large peak indicates the intensity of the x-ray that is diffracted on the (222) plane. The small peak indicates the intensity of the x-ray that diffracted on the (311) plane.

Figure 2:
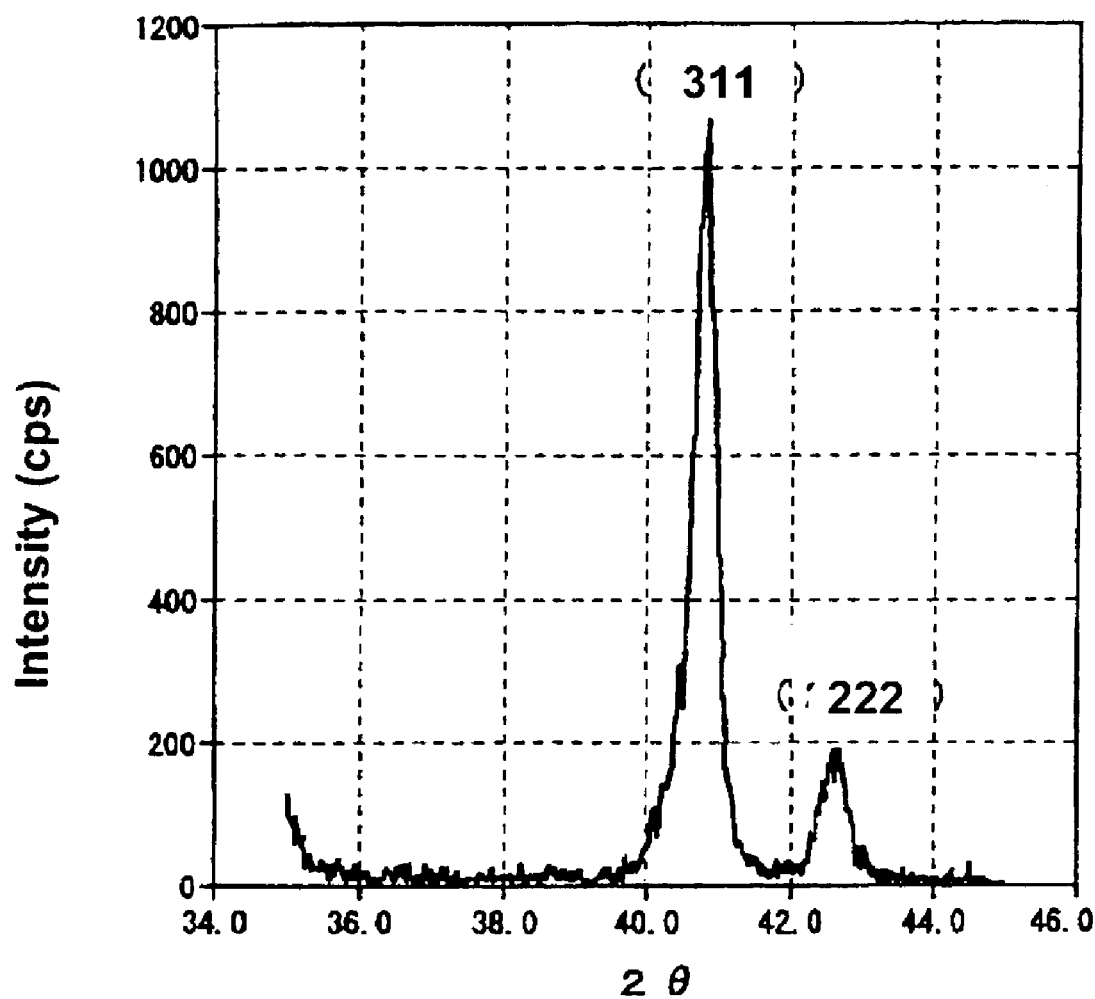
FIG. 2 is an x-ray diffraction graph of a plane perpendicular to a direction in which the magnetostrictive material in accordance with the present invention is formed by compaction in a magnetic field.

FIG. 2 is a graph of x-ray diffraction on a plane vertical to the direction in which the magnetostrictive material according to the present invention is formed by compaction in a magnetic field. The large peak indicates the intensity of the x-ray that diffracted on the (311) plane. The small peak indicates the intensity of the x-ray that diffracted on the (222) plane.

Figure 3:
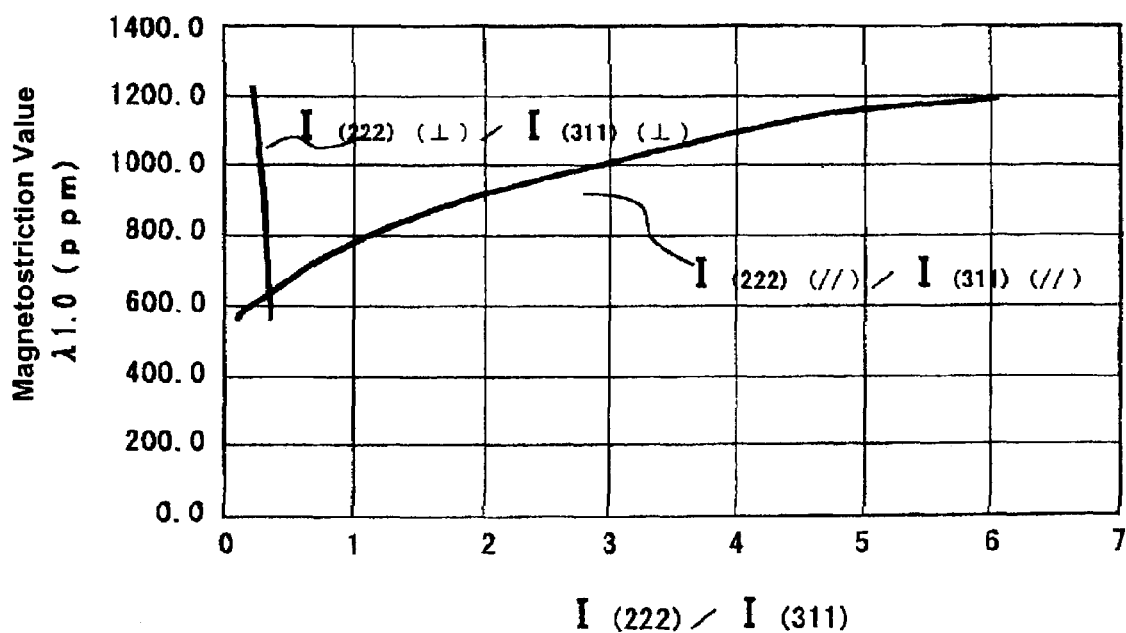
FIG. 3 is a graph indicating the relationship between the ratio of x-ray diffraction intensity on a (222) plane to that on a (311) plane, and the magnetostriction value, in the parallel direction and the vertical direction.

FIG. 3 is a graph showing the relationship between the ratio of x-ray diffraction intensity on the (222) plane to x-ray diffraction intensity on the (311) plane, and the magnetostriction value, in parallel and vertical directions. The magnetostriction value $\lambda$ is measured by applying a magnetic field to a sample and using a strain gauge to measure the strain that varies parallel to the magnetic field applied. Here, the magnetostriction value $\lambda_{1.0}$ (ppm) is $8\times10^4$ A/m (1.0 kOe), which is the value of the magnetic field applied.

As shown in FIG. 3, the magnetostriction value $\lambda_{1.0}$ (ppm) grows larger as the ratio (I (222) (//)/I (311) (//)) of x-ray diffraction intensities in the direction parallel to the magnetic field applied in the compaction in a magnetic field grows larger. On the other hand, the magnetostriction value $\lambda_{1.0}$ (ppm) hardly changes against the value of the ratio (I (222) ($\perp$)/I (311) ($\perp$)) of x-ray diffraction intensities in the direction vertical to the magnetic field applied in compaction in a magnetic field. This is due to the fact that the proportion oriented in the vertical direction is small, which causes the changes to be small as well.

Figure 4:
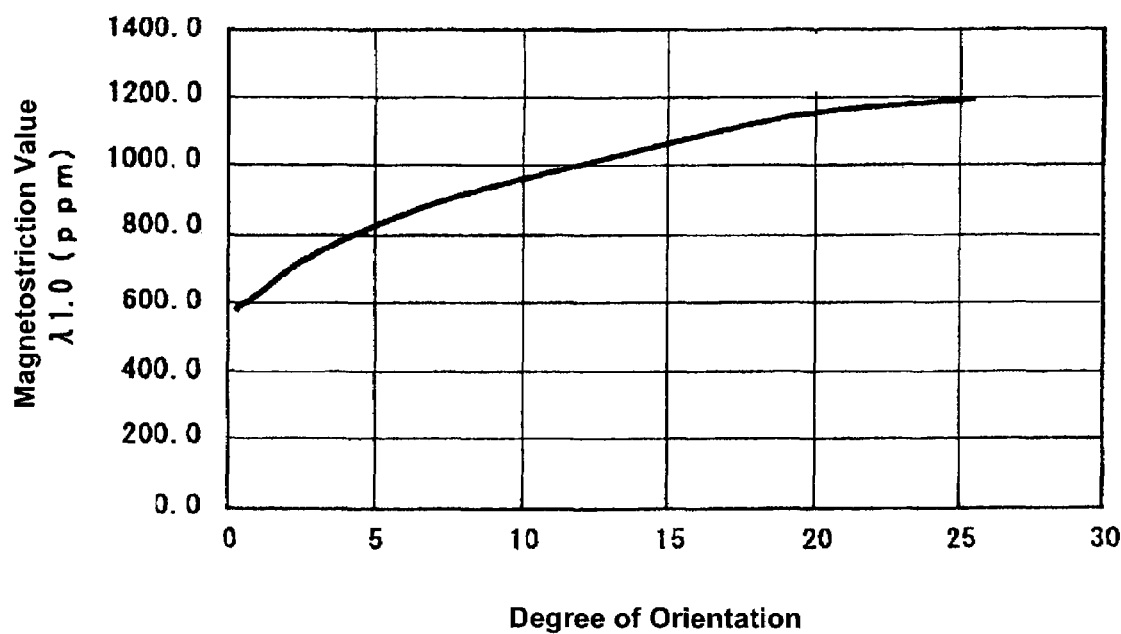
FIG. 4 is a graph indicating the relationship between the degree of orientation and the magnetostriction value $\lambda_{1.0}$ in the vertical direction.

FIG. 4 is a graph showing the relationship between the degree of orientation and the magnetostriction value $\lambda_{1.0}$ in the vertical direction. As shown in FIG. 4, the magnetostriction value $\lambda_{1.0}$ grows larger as the degree of orientation grows larger. For the magnetostrictive material according to the present invention, the magnetostriction value $\lambda_{1.0}$ should preferably be 700 ppm or more. This is due to the fact that the magnetostriction value $\lambda_{1.0}$ of an isotropic magnetostrictive material that does not allow orientation and that has the same composition as the magnetostrictive material according to the present invention is 600-700 ppm, and the magnetostriction value $\lambda_{1.0}$ of the magnetostrictive material according to the present invention must be larger than this value. Accordingly, as shown in FIG. 4, the degree of orientation should be 2.0 or more so that the magnetostriction value that is practical as a displacement amount is 700 ppm or more in a magnetic field of $8\times10^4$ A/m (1.0 kOe).

Further, a zircon titanic acid (PZT) piezoelectric element, which has a large drive voltage and slow response speed, can gain a displacement amount of 800-900 ppm, depending on the electric field, in contrast to conventional ferrite magnetostrictive materials. However, the ferrite magnetostrictive materials' displacement amount due to a magnetic field is only about 30 ppm for practical purposes. Consequently, a material with a small drive voltage, fast response speed and whose displacement amount caused by electric and magnetic fields is 900 ppm or more is sought, and to this end it is even more preferable for the degree of orientation to be 7.0 or more in the magnetostrictive material according to the present invention so that its displacement amount would be at least 900 ppm.

On the other hand, each of the magnetostrictive materials represented by Expression 5: $RT_w$, or preferably by Expression 6: $(Tb_vDy_{1-v})T_w$, has a structure consisting of a main phase $RT_2$ and one or more types of heterogeneous phases including a phase whose primary component is R. Heterogeneous phases are phases whose compositions are other than the composition of the main phase $RT_2$, and include phases rich in T such as $RT_3$, oxide phases and impurity phases, in addition to phases whose primary components are R. As described earlier, the proportion of heterogeneous phases such as phases whose primary components are R and $RT_3$ varies depending on the value of w in $RT_w$. Based on the above, although it is true that it is not favorable for the structure to contain large amounts of such heterogeneous phases, phases whose primary components are R act to prevent the main phase $RT_2$ from becoming oxidized, because R has a property that is readily oxidized, and therefore is prone to react with oxygen that exist in minuscule amounts during manufacturing processes.

It is favorable that phases whose primary components are R exist in the magnetostrictive materials in the following quantitative ratio: $0<[R]/[RT_2]\leq0.45$, where $[R]/[RT_2]$ is the ratio of phases whose primary components are R to the main phase $RT_2$.

Figure 5:
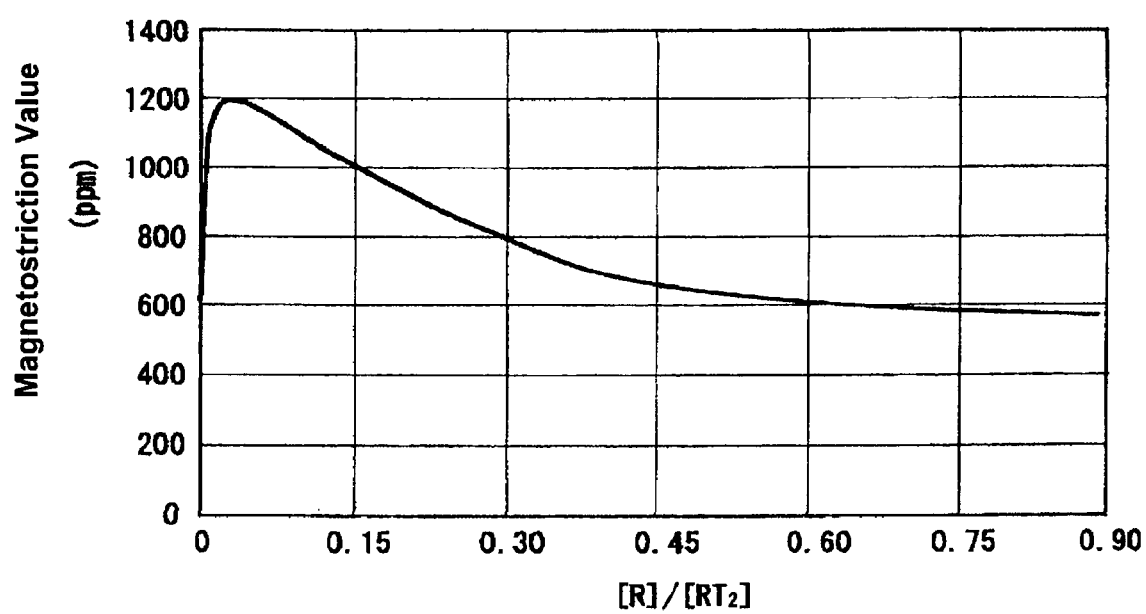
FIG. 5 is a drawing showing the relationship between [R]/[$RT_2$] and the magnetostriction value of a (Tb, Dy) $T_w$ alloy.

FIG. 5 shows the relationship between $[R]/[RT_2]$ and the magnetostriction value of the (Tb, Dy) $T_w$ alloy. The horizontal axis ($[R]/[RT_2]$) shows ratio values of areas of the respective phases observed on scanning electronic microscope (SEM) photographs. The vertical axis shows the magnetostriction value (ppm) in a $8\times10^4$ A/m (1.0 kOe) magnetic field. As shown in FIG. 5, when the value of $[R]/[RT_2]$ is zero, the magnetostriction value is not a large value, but once the value of $[R]/[RT_2]$ exceeds zero and increases slightly, there is a rapid rise in the magnetostriction value. Subsequently, the magnetostriction value falls as the value of $[R]/[RT_2]$ increases further.

This phenomenon can be explained as follows: the area immediately following the point where the value of $[R]/[RT_2]$ exceeds zero is an area where there is the largest amount of the $RT_2$ phase in the alloy, and the magnetostriction value is therefore extremely high in this area. As the value of $[R]/[RT_2]$ increases, i.e., as the volume of phases whose primary components are R in the alloy increases, the magnetostrictive properties of the $RT_2$ phase gradually diminish. As a result, it is preferable that the value of $[R]/[RT_2]$ is 0.45 or less to correspond to an area in which the alloy shows magnetostrictive properties higher than those of the isotropic magnetostrictive material.

On the other hand, the reason for the magnetostriction value to be significantly low when the value of $[R]/[RT_2]$ is near zero is that although there are less precipitations of phases whose primary components are R in the alloy, there are precipitations of phases rich in T such as $RT_3$ phases.

Consequently, by setting the value of $[R]/[RT_2]$ in the range of $0<[R]/[RT_2]\leq0.45$, an magnetostriction value larger than that of the isotropic magnetostrictive material can be obtained in a stable manner. More preferably, the range should be $0.001\leq[R]/[RT_2]\leq0.30$. This is the range that, in the example of the (Tb, Dy) $T_w$ alloy in a $8\times10^4$ A/m (1.0 kOe) magnetic field in FIG. 5, corresponds to an area that shows a stable and high magnetostriction value of 800 ppm or more. And even more preferably, the range should be $0.007\leq[R]/[RT_2]\leq0.094$. In FIG. 5, this is the range that corresponds to an area that shows an extremely high magnetostriction value of 1100 ppm or more.

Figure 6:
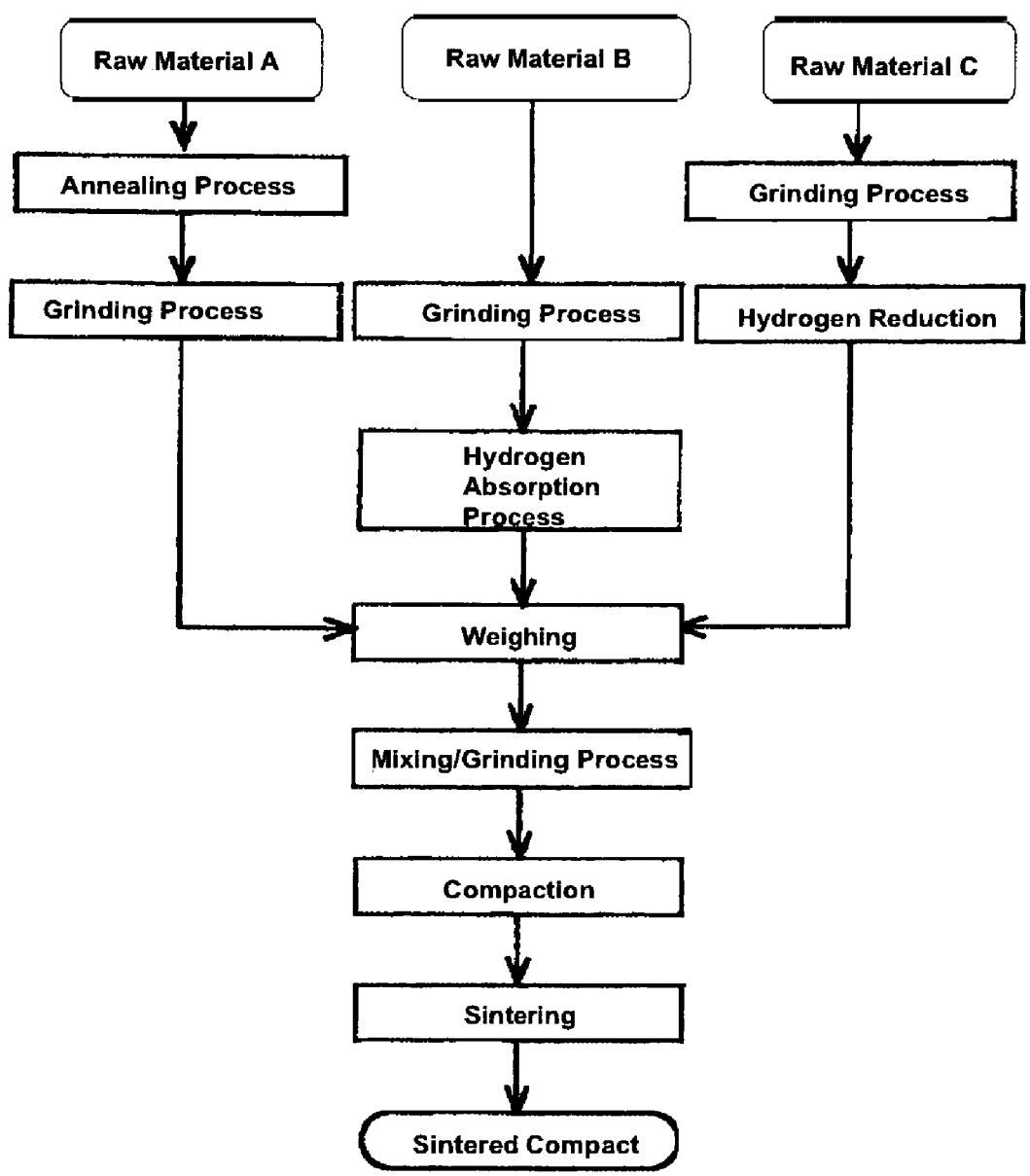
FIG. 6 shows a manufacturing process for manufacturing a magnetostrictive material according to the present invention.

Next, we will describe the method for manufacturing the magnetostrictive material according to the present invention. FIG. 6 shows the manufacturing processes for the magnetostrictive material according to the present invention.

As FIG. 6 shows, the magnetostrictive material according to the present invention involves grinding and mixing powder raw materials A, B and C, and compacting them in a magnetic field.

For the raw material A, a raw material represented by Expression 7: $(Tb_xDy_{1-x})$ is used. Here, T is at least one type of metal selected from among Fe, Co and Ni, and may be Fe alone. This is because Fe forms with Tb and Dy a (Tb, Dy)Fe$_2$ intermetallic compound that has high magnetostrictive properties. Part of Fe may be replaced with Co or Ni, but Co increases magnetic anisotropy but reduces magnetic permeability, while Ni lowers the Curie temperature, and both consequently reduce the magnetostriction value in a condition of room temperature and high magnetic field; thus, Fe should constitute 70 wt. % or more, and preferably 80 wt. % or more. In addition, transition metals that form alloys with rare earth metals Tb, Dy or Ho may be included in the selection. A list of transition metals specifically includes Mn, Cr, Mo and W.

Part of Tb in the raw material A may be replaced with rare earths (R') that exclude Dy and Ho. A list of R', for example, includes Nd, Pr, Gd and Y.

x and y in Expression 7 represent atomic ratios, where $0.35 < x \leq 0.50$ and $1.50 \leq y \leq 2.30$. The reason for such a composition is as follows: in order to further enhance magnetostrictive properties of a magnetostrictive material, it is effective to give anisotropy to the material by orienting the crystal axis having the direction that presents a large magnetostriction. In particular, the [111] axis is preferable in the $Tb_{0.3}Dy_{0.7}Fe_{2.0}$ crystal, since it is an easy axis of magnetization. However, when x is small, the amount of Tb contained in the raw material A is small, and this makes the orientation in the [111] axis direction difficult. And when x exceeds 0.5, the mixing ratio of the raw material C must be increased in order to obtain the magnetostrictive material represented by Expression 7, thus this reduces the ratio of the raw material A, which decreases the degree of orientation in the [111] axis direction after sintering. For these reasons, x should be in the range described above.

When y is less than 1.50, the mixing ratio of the raw material C must be increased, which decreases the ratio of the raw material A, which in turn decreases the degree of orientation in the [111] axis direction after sintering. When y is large, there are more phases rich in T such as (Tb, Dy)T$_3$; this reduces the degree of orientation that results from compaction in magnetic field, and this in turn decreases the degree of orientation of the magnetostrictive material after sintering. For these reasons, y should be in the range described above.

For the raw material B, a raw material represented by Expression 8: $Dy_tT_{1-t}$ is used. Here, T is at least one type of metal selected from among Fe, Co and Ni, and may be Fe alone. Part of Fe may be replaced with Co or Ni, and when this is done the raw material B becomes more easily ground and contributes to a higher sintering density after sintering. Dy may include Tb or Ho, or may include both.

t in Expression 8 represents atomic ratio in the range of $0.37 \leq t \leq 1.00$. Since Dy and T have an eutectic point, compositions in which t is outside this range yield only a small amount of $R_2T$, which is the eutectic composition, in a mixture of the raw materials A and C, and this makes it difficult to increase the sintering density.

In addition, it is preferable to perform hydrogen absorption treatment on the raw material B, as indicated in FIG. 6. Rare earth metals such as Dy are easily oxidized and therefore form oxide films in the presence of even a small amount of oxygen. An oxide film formed on the raw material B impedes the progress of sintering in the subsequently sintering process, and this causes the density of the sintered compact not to increase. In view of this, the raw material B is made to absorb hydrogen to make it less prone to becoming oxidized.

Further, by having the raw material B absorb hydrogen, strains are caused in crystals as a result of hydrides forming or hydrogen atoms penetrating into the crystals. For this reason, when it is mixed with the raw material A and the raw material C and pressure is applied to form a green compact, the pressure causes the destruction of the raw material B particles to proceed; the raw material B particles in their ground and fine state can make their way in between the raw material A particles and contribute to forming a sintered compact with high density in the subsequent sintering.

The amount of hydrogen to be absorbed by the raw material B should be in the range of 7000 ppm to 22,000 ppm. When the amount of hydrogen absorbed is under 7000 ppm, the internal strain of the raw material B is small due to the small amount of hydrogen involved and this fails to lead to the destruction of the raw material B particles when compacting. And when the amount of hydrogen absorbed is over 22,000 ppm, the fine pulverization of the raw material B particles reaches saturation and there are no additional absorption effects.

For the raw material C, a raw material containing T is used. As discussed earlier, T is a transition metal, preferably Fe, Co or Ni, and Fe is the most preferred. Fe fuses during sintering to form an intermetallic compound with Tb or Dy and increases the magnetostriction value.

The mixing proportions of the raw materials A, B and C may be determined appropriately to obtain a magnetostrictive material as represented by Expression 6. The raw material A may be 50 wt. % or more but less than 100 wt. %, preferably between 60 wt. % and 95 wt. %, against the magnetostrictive material. When there isn't enough raw material A, there is not enough material to be oriented while compacting in a magnetic field, so that the degree of orientation of the magnetostrictive material obtained from sintering is low. And when there is too much raw material A, the ratio of the raw material B that contains hydrogen becomes small, which result in a failure to obtain a sintered compact with high density.

The raw material B may be 40 wt. % or less, preferably between 5 wt. % and 30 wt. %, against the magnetostrictive material. When there isn't enough raw material B, a sintered compact with high density cannot be obtained as described above. And when there is too much raw material B, the ratio of the raw material A becomes small and the degree of orientation fails to be enough.

The amount of the raw material C to be added is determined by taking into account the proportions of the raw materials A and B and so that it would correspond to the atomic ratio w of T in Expression 6.

The raw materials A, B and C are weighed out, mixed and ground, as indicated in FIG. 6. The average particle size of each of the raw materials should be 1-100 μm, more preferably 5-20 μm. When the average particle size is too small, the raw materials become oxidized during manufacture. Further, with small average particle size, the magnetization of the particles is also small, so that the magnetic moment of the magnetic field becomes small; this makes it difficult for the particles to rotate, and this in turn makes it difficult to attain a high degree of orientation. When the average particle size is too large, sintering does not proceed smoothly and high sintering density cannot be achieved. On the other hand, when performing an HIP treatment, sintering can proceed even when the average particle size of powder is 10 μm or more, as discussed earlier.

Grinding can be conducted by an appropriate grinding machine such as a wet ball mill, attritor or atomizer. Of these, an atomizer is particularly favorable. The reason for this is that since impact and shearing can be applied simultaneously with the atomizer, aggregation of powder can be prevented and there is little adhesion of powder to the device, which together lead to higher productivity.

After mixing, the mixture is compacted into a desired shape before sintering By performing this compaction process in a magnetic field, the raw material A among other materials is aligned in a certain direction, so that the magnetostrictive material after sintering is oriented in the [111] direction. The magnetic field applied should be $24 \times 10^4$ A/m or more, preferably $48 \times 10^4$ A/m or more. The direction of the magnetic field may be either vertical or parallel to the direction of the pressure applied. The compaction pressure should be $4.9 \times 10^4$ Pa or more, preferably $2.9 \times 10^5$ Pa or more.

Here, in the magnetostrictive material, the easy axis of magnetization for the raw material A is in the direction of the [111] axis, while it is in the direction of the [110] axis for the raw material B, and each of the raw materials A and B has a large crystal magnetic anisotropy. Consequently, when compacting in a magnetic field, the direction of the [111] axis of the raw material A and the direction of the [110] axis of the raw material B become oriented in a direction parallel to the magnetic field. However, the raw material B acts as a fusing agent during sintering: when it is made to contain hydrogen it becomes finely ground by the pressure applied during compaction in the magnetic field, which makes the raw material B more easily fused, so that it fuses with the raw material C and forms an alloy with the raw material A, which has become oriented in the direction of the [111] axis, and thereby forms a magnetostrictive material. Furthermore, by having the raw material B become finely ground during compaction in the magnetic field, the particles of the raw material A become more easily rotatable, which makes the latter more easily oriented towards the direction of the magnetic field.

The sintering conditions for the compact are not particularly limited but the temperature should be 1100° C. or higher, preferably 1150-1250° C., and should be done for one to ten hours. The atmosphere for sintering should be non-oxidized and should be an inert gas, such as Ar or nitrogen, or vacuum atmosphere. Magnetostrictive materials with higher density and with less internal strains can be obtained by rendering the sintering process and/or HIP treatment process discussed earlier in the first and second manufacturing methods for sintered compacts.

The present invention will be described in greater detail below with embodiment examples.

TEST EXAMPLE 1

For a raw material A, Tb, Dy and Fe were weighed out, fused in an inert gas atmosphere of Ar gas and an alloy was manufactured. Here, the composition was $Tb_{0.4}Dy_{0.6}Fe_{1.94}$. A heat treatment to anneal the raw material A was rendered, the concentration distribution of each of the metal elements during the manufacture of the alloy was made uniform, the heterogeneous phases precipitated were eliminated, and the raw material A was ground with an atomizer.

For a raw material B, Dy and Fe were weighed out, fused in an inert atmosphere of Ar gas and an alloy was manufactured. Here, the composition was $Dy_{2.0}Fe$. The raw material B was ground with an atomizer in a manner similar to the raw material A.

For a raw material C, Fe that was reduction-treated to remove oxygen in a hydrogen gas atmosphere was used.

The raw materials A, B and C thus obtained were weighed out, ground and mixed, and an alloy powder with the composition $Tb_{0.3}Dy_{0.7}Fe_{1.88}$ was compacted in a magnetic field of $80 \times 10^4$ A/m.

Figure 7:
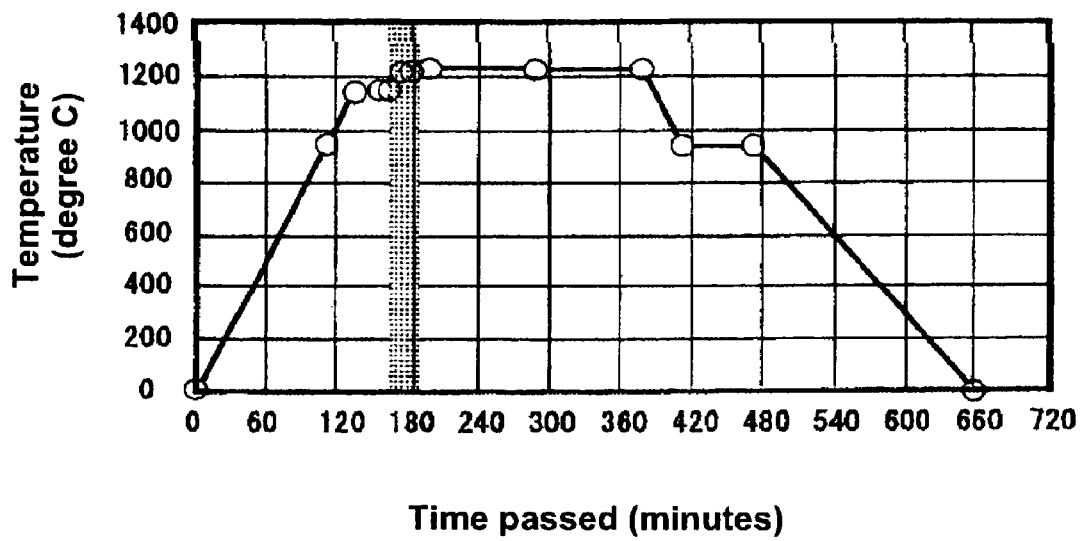
FIGS. 7(a) and 7(b) show the temperature (° C.) of heat treatment against time passed (in minutes) and the density of the sintered compact (%) against time passed (in minutes), respectively.
Figure 7:
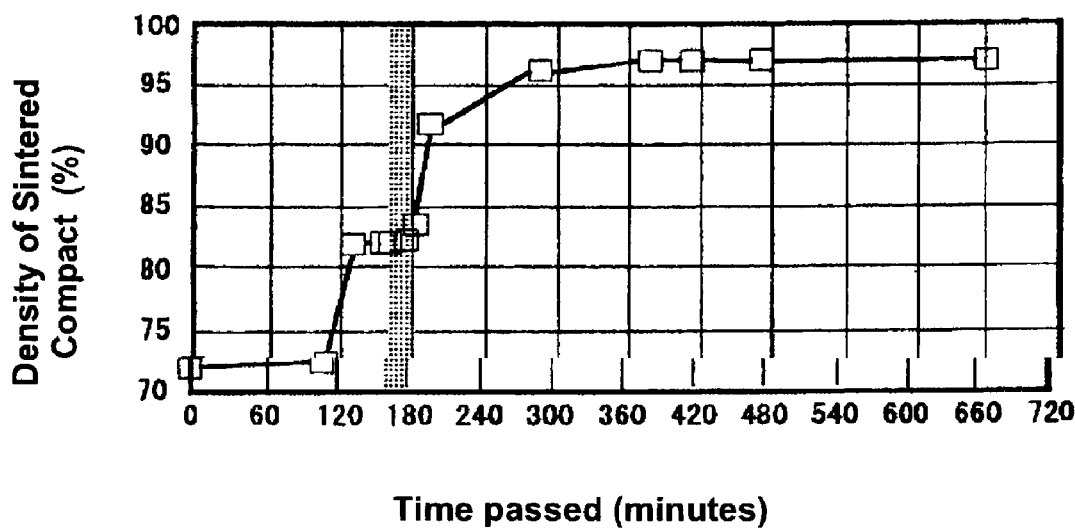

The temperature of the compacted alloy powder was raised in an oven and sintered in a mixed atmosphere of 35 vol. % hydrogen gas and 65 vol. % Ar gas in a stable temperature zone of 1150-1230° C., and the density of the resulting sintered compact is shown in FIG. 7. FIG. 7(a) indicates the temperature (° C.) of the heat treatment against the time passed (in minutes), and FIG. 7(b) indicates the density of the sintered compact (%) against the time passed (in minutes). Here, the density of the sintered compact represents the ratio of the specific gravity of the sintered compact to the absolute specific gravity of the alloy. The zones indicated by black dots in FIGS. 7(a) and (b) are zones with a mixed atmosphere of 35 vol. % hydrogen gas and 65 vol. % Ar gas, and other zones are an atmosphere of Ar gas alone. As shown in FIG. 7(b), the density of the sintered compact soars dramatically to above 90% immediately after the heat treatment in a mixed gas atmosphere. Further, by heat treating for approximately 180 minutes in a stable temperature zone of 1225° C., the density of the sintered compact can reach 95% or more.

Based on the above, we can see that a high density sintered compact can be obtained by rendering a heat treatment in a mixed gas atmosphere of hydrogen gas and Ar gas on the alloy powder molded.

TEST EXAMPLE 2

Next, the compacted alloy powder was sintered in a temperature zone of 650-1238° C. as the volume ratio (concentration) of hydrogen gas in a mixed gas of Ar gas and hydrogen gas was varied between 0 and 100 vol. %, and the density of the sintered compact and magnetostriction value were measured. The results are shown in Tables 1 and 2 and FIGS. 8 and 9. Note, however, that the hydrogen storage material in Table 1 refers to a sintered compact that was made using an alloy powder in which one of its raw materials, raw material B, was rendered a hydrogen absorption treatment, and the non-hydrogen storage material in Table 2 refers to a sintered compact that was made using an alloy powder which had not been rendered any hydrogen absorption treatments. The hydrogen absorption treatment was performed by having hydrogen absorbed in a hydrogen gas atmosphere while the temperature was maintained at a constant temperature, and subsequently changing the atmosphere to an Ar gas atmosphere and maintaining this for a certain amount of time.

TABLE 1

Hydrogen Storage Material's Density of Sintered Compact and Magnetostriction value

| | Hydrogen Storage Material | |
|---|---|---|
| Hydrogen Concentration (vol. %) | Density of Sintered Compact (%) | Magnetostriction value (ppm) |
| 0 | 88.1 | 1165 |
| 20 | 94.5 | 1164 |
| 30 | 96.3 | 1161 |
| 35 | 97.4 | 1164 |
| 40 | 97.8 | 1050 |
| 50 | 97.7 | 880 |
| 100 | 98.1 | 660 |

Figure 8:
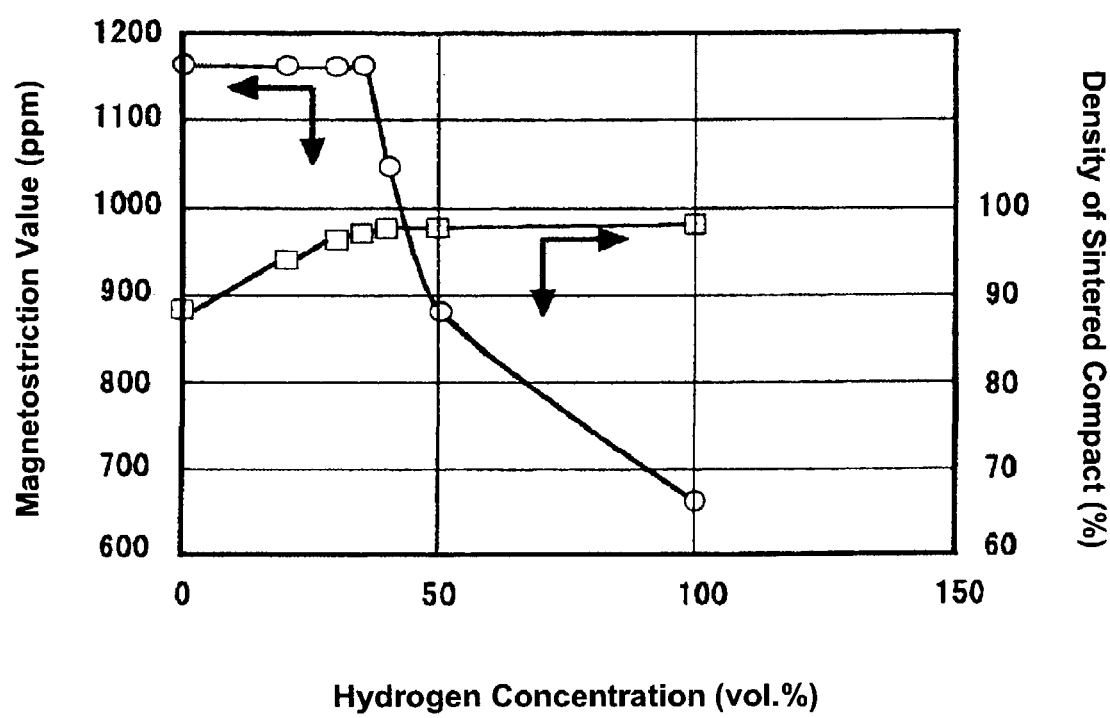
FIG. 8 is a graph showing the density and magnetostriction value of a sintered compact in which a hydrogen storage material was used and which was sintered as the content of hydrogen gas was varied between 0 and 100%.

From Table 1 and FIG. 8, we can see that the sintered compact according to the present invention shows gradual increases in its density as the concentration of hydrogen gas increases, and in particular that the density of the sintered compact reaches 90% and higher when there is even a small amount of hydrogen gas. However, the magnetostriction value of the sintered compact falls when the concentration of hydrogen gas exceeds 35 vol. % and falls to 880 ppm, which is below 1000 ppm, when the concentration of hydrogen gas is 50 vol. % or more.

TABLE 2

Non-Hydrogen Storage Material's Density of Sintered Compact and Magnetostriction value

| | Non-Hydrogen Storage Material | |
|---|---|---|
| Hydrogen Concentration (vol. %) | Density of Sintered Compact (%) | Magnetostriction value (ppm) |
| 0 | 84.5 | 1154 |
| 20 | 88.9 | 1161 |
| 30 | 90.5 | 1161 |
| 35 | 92.2 | 1165 |
| 40 | 92.5 | 1090 |
| 50 | 93.1 | 890 |
| 100 | 94.4 | 680 |

Figure 9:
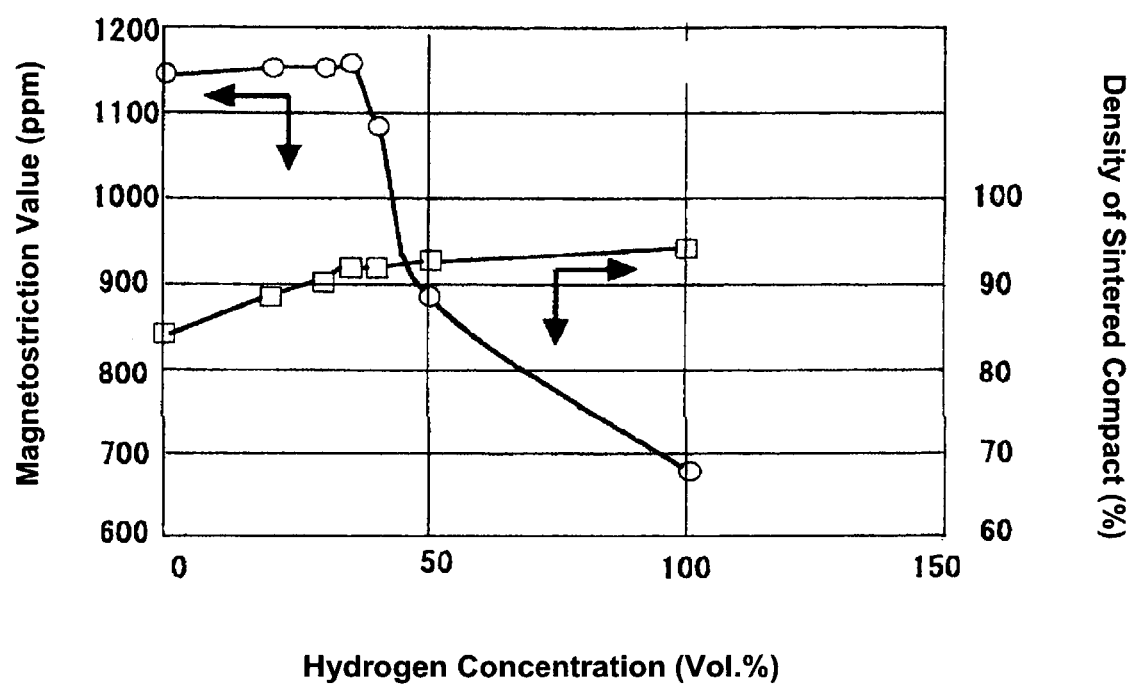
FIG. 9 is a graph showing the density and magnetostriction value of a sintered compact in which a non-hydrogen storage material was used and which was sintered as the content of hydrogen gas was varied between 0 and 100%.

From Table 2 and FIG. 9, we can see that the sintered compact made using a non-hydrogen storage material also shows gradual increases in its density as the concentration of hydrogen gas increases, and that the density of the sintered compact reaches 90% and higher when the concentration of hydrogen gas is 30 vol. % or more. However, the magnetostriction value of the high density sintered compact falls when the concentration of hydrogen gas exceeds 35 vol. % and falls to 890 ppm, which is below 1000 ppm, when the concentration of hydrogen gas is 50 vol. % or more.

As a result, we can see that the concentration X of hydrogen gas may preferably be less than 50 vol. % but greater than 0 vol. % when using a raw material containing either the hydrogen storage material or the non-hydrogen storage material.

TEST EXAMPLE 3

In a heat treatment of the sintered compact, the compacted alloy powder was sintered in a temperature zone of 650-1225° C. as the atmosphere was varied from an Ar gas atmosphere to a mixed atmosphere of 35 vol. % hydrogen gas and 65 vol. % Ar gas, and the density of the sintered compact and magnetostriction value were measured. The raw material B was rendered a hydrogen absorption treatment. The results are shown in Table 3 and FIG. 10. In Table 3, the temperature at which the atmosphere shifted from a mixed atmosphere to an atmosphere of Ar gas alone is the hydrogenation ending temperature.

TABLE 3

Beginning Temperature of Mixed Gas Atmosphere, Density of Sintered Compact and Magnetostriction value

| 35 vol. %[1]) Hydrogenation Beginning Temp. (° C.) | 35 vol. %[1]) Hydrogenation Ending Temp. (° C.) | Density of Sintered Compact (%) | Magnetostriction value (ppm) |
|---|---|---|---|
| 650 | 1225 | 97.5 | 860 |
| 950 | 1225 | 97.6 | 1030 |
| 1150 | 1225 | 97.4 | 1164 |
| 1200 | 1225 | 95.2 | 1158 |
| 1220 | 1225 | 93.1 | 1162 |

*[1]): Indicates a mixed gas atmosphere of hydrogen: Ar gas = 35 (vol. %): 65 (vol. %).

Figure 10:
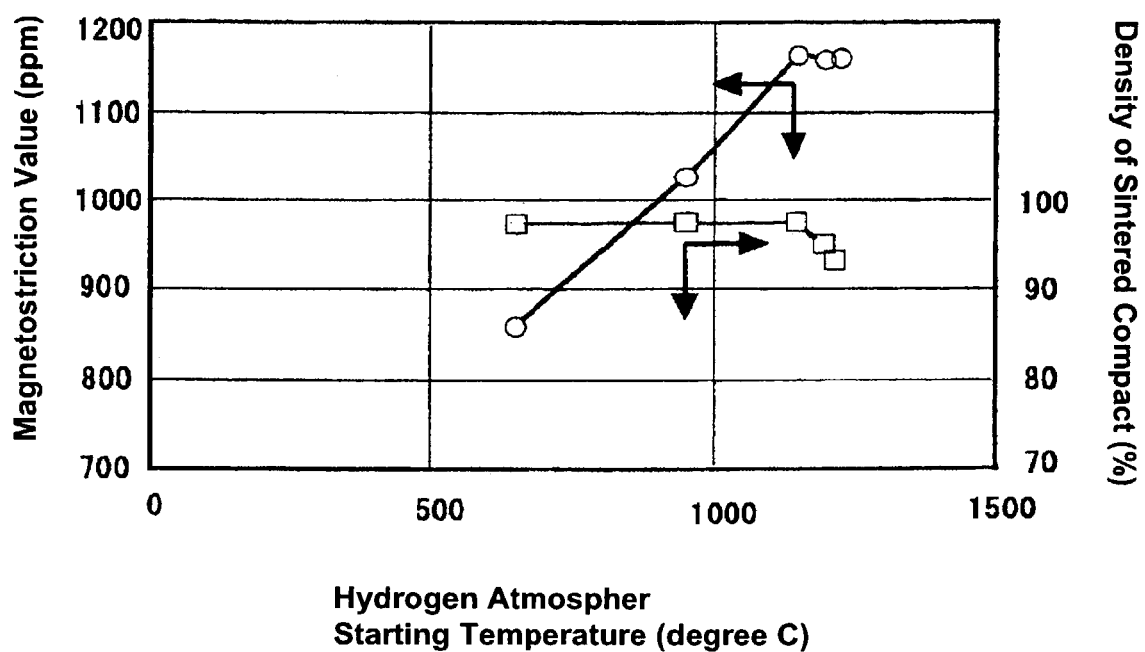
FIG. 10 is a graph showing the density and magnetostriction value of a sintered compact sintered as the atmosphere was varied from an Ar gas atmosphere to a mixed atmosphere of 35 vol. % hydrogen gas and 65 vol. % Ar gas.

From Table 3 and FIG. 10, we can see that in a heat treatment of the sintered compact according to the present invention, the density of the sintered compact is extremely high with virtually all values at 97% or more when the hydrogenation beginning temperature, at which a mixed atmosphere of hydrogen gas and Ar gas is created, is 650° C. or higher, but the density of the sintered compact gradually falls once the hydrogenation beginning temperature exceeds 1150° C. The magnetostriction value grows larger as the hydrogenation beginning temperature rises, but it reaches saturation when the hydrogenation beginning temperature exceeds 1150° C.

As a result, we can see that hydrogen gas should be mixed at 650° C. at minimum to begin to create a mixed atmosphere of hydrogen gas and Ar gas.

TEST EXAMPLE 4

In a heat treatment of the sintered compact, the compacted alloy powder was sintered as the atmosphere was varied from an Ar gas atmosphere to a mixed atmosphere of 35 vol. % hydrogen gas and 65 vol. % Ar gas at the temperature of 1150° C., and as the hydrogenation ending temperature, at which point the mixed gas atmosphere shifted to an atmosphere of Ar gas alone, was varied; and the density of the sintered compact and magnetostriction value were measured. The raw material B was rendered a hydrogen absorption treatment. The results are shown in Table 4 and FIG. 11.

TABLE 4

Ending Temperature of Mixed Gas Atmosphere, Density of Sintered Compact and Magnetostriction value

| 35 vol. %[1]) Hydrogenation Beginning Temp. (° C.) | 35 vol. %[1]) Hydrogenation Ending Temp. (° C.) | Density of Sintered Compact (%) | Magnetostriction value (ppm) |
|---|---|---|---|
| 1150 | 1200 | 93.3 | 1163 |
| 1150 | 1220 | 95.5 | 1161 |
| 1150 | 1225 | 97.4 | 1164 |
| 1150 | 1230 | 98.2 | 1090 |
| 1150 | 1235 | 98.2 | 920 |
| 1150 | 1235.5 | 98.3 | 880 |

*[1]): Indicates a mixed gas atmosphere of hydrogen Ar gas = 35 (vol. %) 65 (vol. %).

Figure 11:
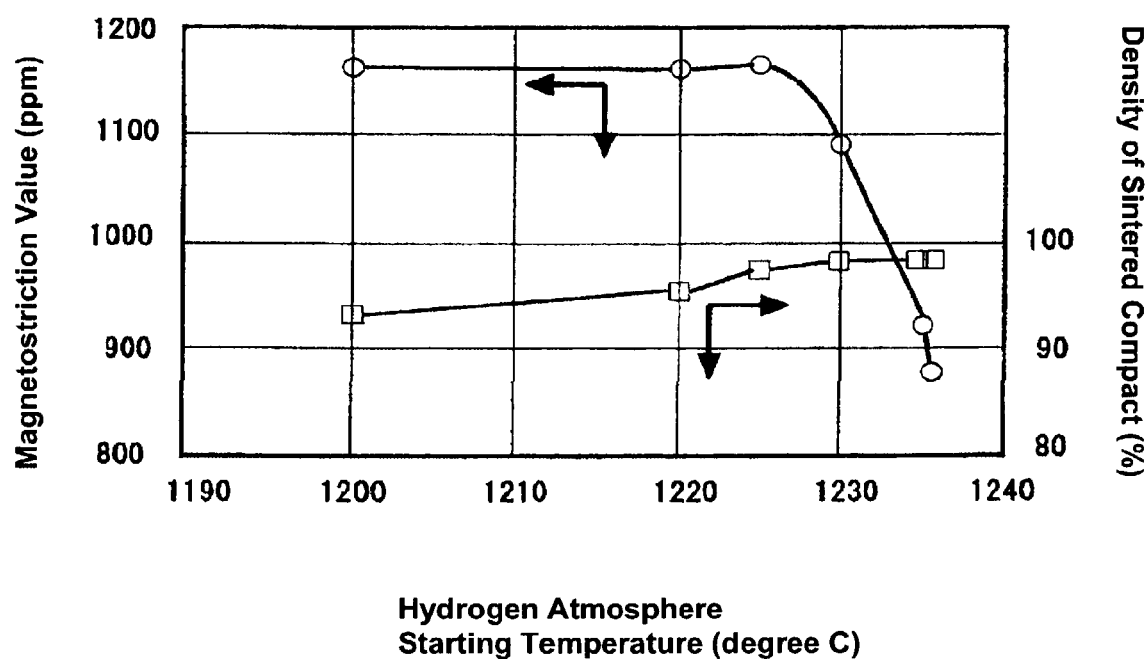
FIG. 11 is a graph showing the density and magnetostriction value of a sintered compact sintered by varying the hydrogenation ending temperature, at which point the shift from a mixed atmosphere of 35 vol. % hydrogen gas and 65 vol. % Ar gas to an atmosphere of Ar gas alone takes place.

From Table 4 and FIG. 11, we can see that the density of the sintered compact rises to 93.3% and higher when the hydrogenation ending temperature is 1200° C. or higher, and that the density of the sintered compact increases as the ending temperature rises. However, the magnetostriction value of the sintered compact falls drastically when the ending temperature exceeds 1230° C. and falls to 920 ppm, which is below 1000 ppm, at 1235° C.

As a result, we can see that the hydrogenation ending temperature preferably should not exceed 1230° C., and more preferably 1220° C.

EMBODIMENT EXAMPLE 1 AND COMPARATIVE EXAMPLES 1-4

Compositions of sintered compacts in Embodiment Example 1 and Comparative Examples 1-4 are shown in Table 5.

In Embodiment Example 1, a raw material A having the composition $Tb_{0.4}Dy_{0.6}Fe_{1.94}$, a raw material B having the composition $Dy_{2.0}Fe$, and a raw material C in which Fe was reduction-treated to remove oxygen in a hydrogen gas atmosphere were weighed out, ground, mixed, and the alloy powder having the final composition $Tb_{0.3}Dy_{0.7}Fe_{1.88}$ was formed by means of compaction in a magnetic field of $80 \times 10^4$ A/m. Subsequently, it was sintered in an Ar gas atmosphere and in a mixed atmosphere of hydrogen gas and Ar gas, and a sintered compact was manufactured. Sintering was conducted under the heat treatment conditions indicated in FIG. 7, so that a mixed atmosphere of 35 vol. % hydrogen gas and 65 vol. % Ar gas was created in a stable temperature zone and the atmosphere was subsequently changed to an Ar gas atmosphere. The raw material B was allowed to absorb hydrogen while the temperature was maintained at 150° C. in a hydrogen gas atmosphere, then the temperature was raised to 400° C. in a hydrogen gas atmosphere, and finally at 400° C. the atmosphere was changed to an Ar gas atmosphere, which was maintained for a certain amount of time to perform the hydrogen absorption treatment.

Comparative Example 1 is the same as the embodiment 1, including composition, except that sintering was done in an atmosphere of Ar gas alone.

Comparative Example 2 is the same as the embodiment 1, including composition, except that a raw material B that was not hydrogen absorption-treated was used and that sintering was done in an atmosphere of Ar gas alone.

Comparative Example 3 is the same as the embodiment 1, except that a raw material B that was not hydrogen absorption-treated was used and that sintering was done in an atmosphere of Ar gas alone.

Comparative Example 4 is a sintered compact manufactured by the U.S. manufacturer ETREMA, using the single crystal growth method. Its composition is $Tb_{0.3}Dy_{0.7}Fe_{1.93}$, which is generally the same as the composition of Embodiment Example 1 and other examples.

Figure 12:
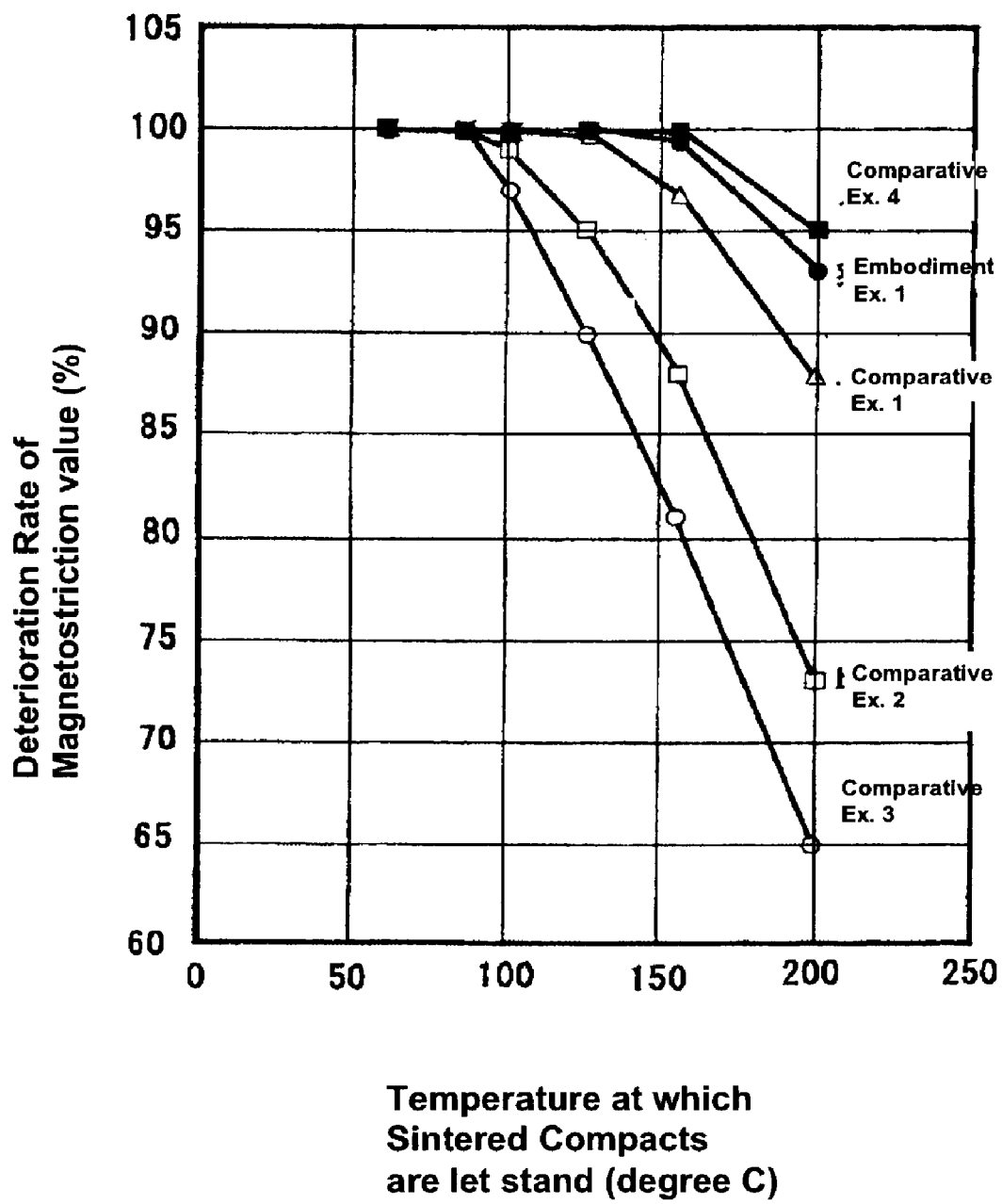
FIG. 12 is a graph showing the deterioration rate of magnetostriction value when each of the sintered compacts is let stand for 1000 hours in atmospheric air.

The sintered compacts obtained from Embodiment Example 1 and Comparative Examples 1-3 were each let stand for 1000 hours in atmospheric air at 85° C., 100° C., 125° C., 155° C. and 200° C.; magnetostrictive properties were measured; and the deterioration rate of magnetostriction value was measured for each. The relationship between the temperature (C) at which the sintered compacts were let stand and the deterioration rate of magnetostriction value (%) is shown in FIG. 12. The deterioration rate of magnetostriction value for each sintered compact is expressed in terms of the ratio of the magnetostriction value at each of the various temperatures to the initial magnetostriction value, which is 100%.

TABLE 5

Composition and Other Information concerning Sintered Compacts in Embodiment 1 and Comparative Examples 1-4

| Sample No. Symbol in FIG. 12 | Composition | Conditions for Sintered Compact | Density of Sintered Compact (%) |
|---|---|---|---|
| Embodiment Ex. 1 ● | $Tb_{0.3}Dy_{0.7}Fe_{1.88}$ | Used raw material B that was hydrogen absorption-treated. Sintered in a mixed atmosphere of 35 vol. %[1)] hydrogen gas and Ar gas. | 97 |
| Comparative Ex. 1 ▲ | $Tb_{0.3}Dy_{0.7}Fe_{1.89}$ | Used raw material B that was hydrogen absorption-treated. Sintered in an atmosphere of Ar gas alone. | 91 |
| Comparative Ex. 2 □ | $Tb_{0.3}Dy_{0.7}Fe_{1.89}$ | Did not use raw material B that was hydrogen absorption-treated. Sintered in an atmosphere of Ar gas alone. | 84 |
| Comparative Ex. 3 ○ | $Tb_{0.3}Dy_{0.7}Fe_{1.89}$ | Did not use raw material B that was hydrogen absorption-treated. Sintered in an atmosphere of Ar gas alone. | 84 |
| Comparison Ex. 4 ■ | $Tb_{0.3}Dy_{0.7}Fe_{1.93}$ | Single crystal (manufactured by ETREMA). | 99.5 |

*[1)]: Indicates a mixed gas atmosphere of hydrogen: Ar gas = 35 (vol. %): 65 (vol. %).

As we can see from Table 5 and FIG. 12 and from comparing Embodiment Example 1 to Comparative Example 1, the density of sintered compact can be increased from 91% to 97% by using a mixed atmosphere of hydrogen gas and Ar gas. As a result of this, when sintered compacts are let stand for 1000 hours at a high temperature of 200° C., the deterioration rates of magnetostriction value for Embodiment Example 1 are 90% or more, while the deterioration rate for Comparative Example 1 falls to less than 90%, as shown in FIG. 12. This shows that by increasing the density of sintered compact, the deterioration rate of magnetostriction value can be maintained at a high rate and the deterioration suppressed.

When part of raw materials is not hydrogen absorption-treated and the heat treatment during sintering is conducted in an atmosphere of Ar gas alone instead of a mixed atmosphere of hydrogen gas and Ar gas, as in Comparative Examples 2 and 3, we can see that the density of the sintered compact in each case is low at 84%. Further, while the magnetostriction value of Embodiment Example 1 hardly shows any drop when let stand at high temperatures of 125° C. and 155° C., the magnetostriction value of Comparative Example 2 drops to 95% when let stand at a high temperature of 125° C., and that of Comparative Example 3 drops to 90%; when let stand at a high temperature of 155° C., the magnetostriction value of Comparative Example 2 drops dramatically to 88% and that of Comparative Example 3 to 81%. We can see from these that because the density of sintered compact can be increased by in a mixed atmosphere of hydrogen gas and Ar gas during sintering than in an atmosphere of Ar gas alone, the deterioration of the magnetostriction value of magnetostrictive material can be restricted.

Furthermore, when Embodiment Example 1 and Comparative Example 4 are compared, we can see that Comparative Example 4 is a single crystal with a density of 99.5%, which is very close to 100%, and that Embodiment Example 1's deterioration rate of magnetostriction value is equivalent to that of the single crystal Comparative Example 4. Based on the above, we can see that by using the method for manufacturing sintered compact according to the present invention, a sintered compact or magnetostrictor with properties virtually equivalent to those of a single crystal can be manufactured at low cost and in shapes desired through the use of metal molds that allows freedom in the selection of shapes.

EMBODIMENT EXAMPLE 2

For a raw material A, Tb, Dy and Fe were weighed out and fused in an Ar gas atmosphere to make an alloy having the composition $Tb_{0.4}Dy_{0.6}Fe_{1.93}$. For a raw material B, Dy was made to absorb hydrogen to make $DyH_2$. For a raw material C, Fe was used. The raw materials A, B and C were mixed and ground with an atomizer in an Ar gas atmosphere. The average particle size was measured using a subsieve sizer (by Fisher).

Figure 13:
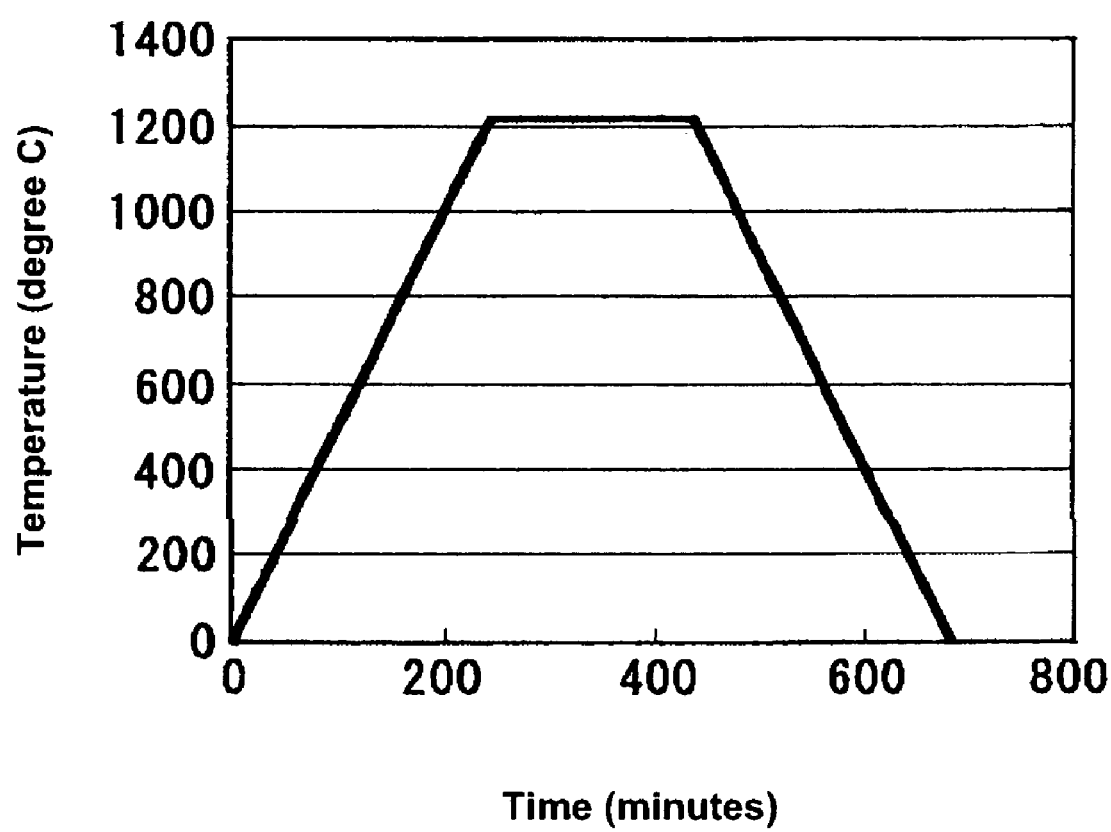
FIG. 13 is a graph showing heat treatment conditions for sintering according to the present invention.
Figure 14:
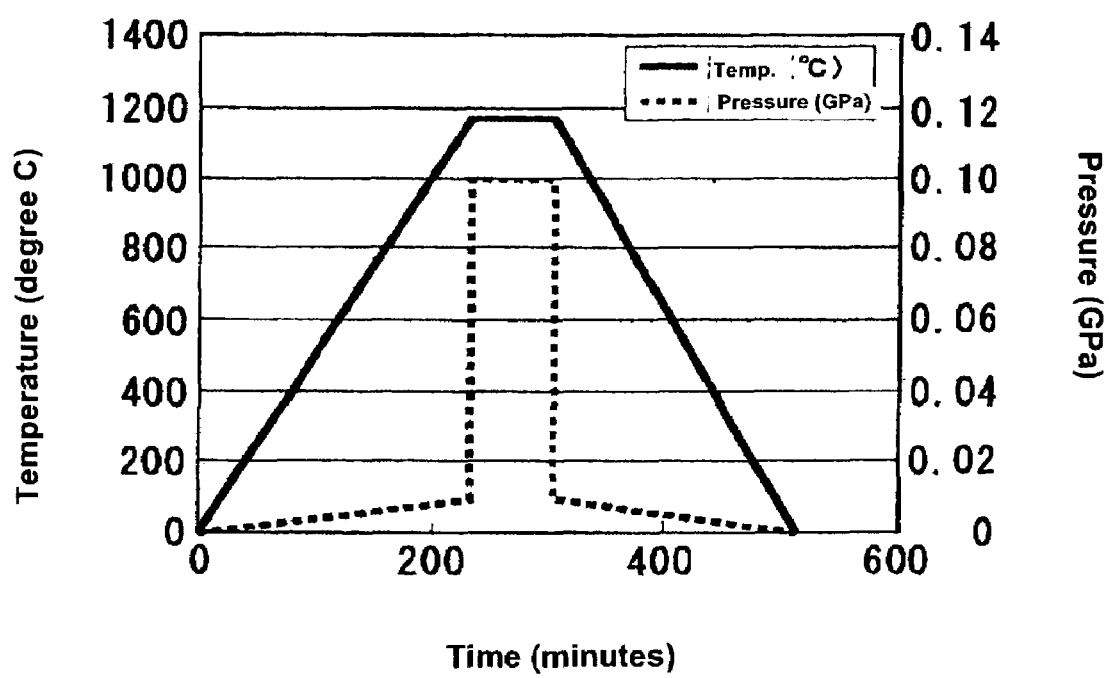
FIG. 14 is a graph showing HIP treatment conditions according to the present invention.
Figure 15:
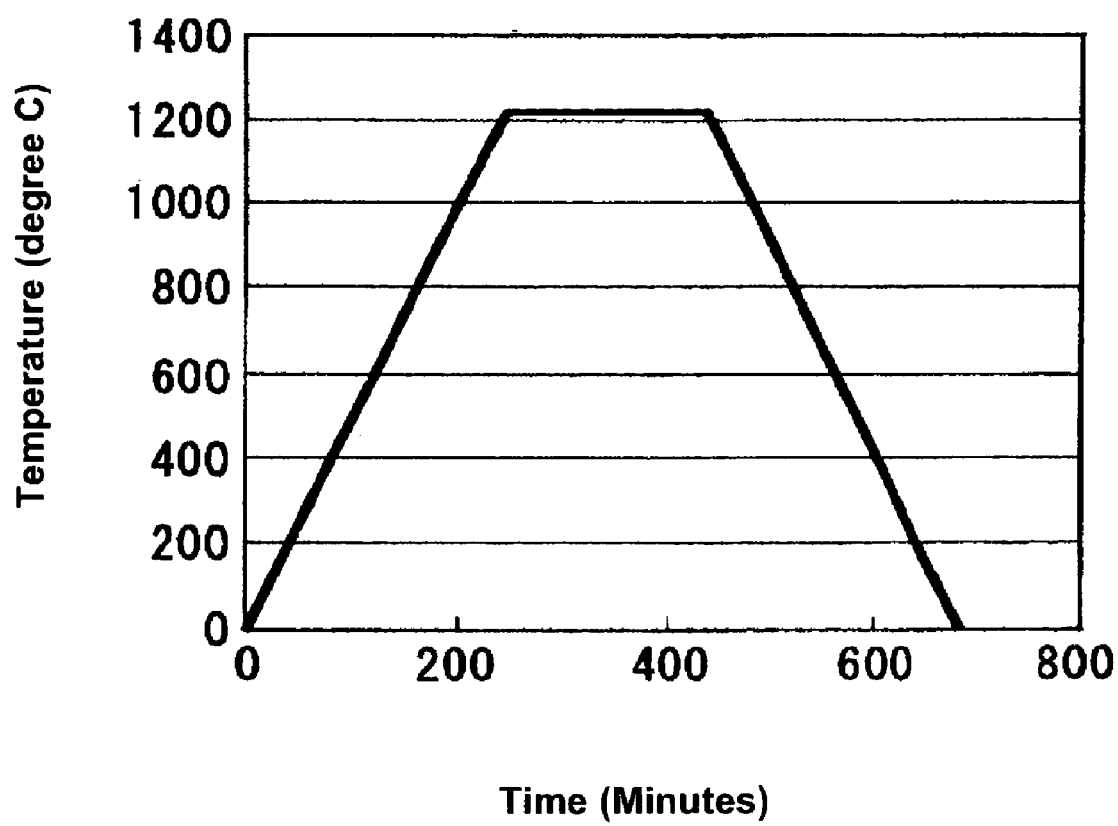
FIG. 15 is a graph showing heat treatment conditions for annealing according to the present invention.

Next, the resulting powder was compacted into a cylindrical shape with dimensions of 3.5×30 mm in a magnetic field of $80\times10^4$ A/m. The temperature of the green compact was raised in an Ar gas atmosphere and when the temperature reached 600° C., the green compact was sintered in vacuum. The temperature profile for this process is shown in FIG. 13. The sintered compact was then HIP-treated. The temperature and pressure profiles for this process are shown in FIG. 14. The HIP-treated product was then annealed. The temperature profile for this process is shown in FIG. 15.

The relative density and magnetostriction value of the sintered compact thus manufactured through these processes are shown in Table 6.

The relative density of the sintered compact is expressed as the ratio (%) of each sample's dimensions measured to true density. A strain gauge was affixed to a sample in the shape of a cylinder with dimensions of 3.5×30 mm, the sample is placed in a magnetic field and the magnetostriction value was measured.

COMPARATIVE EXAMPLE 5

Comparative Example 5 was manufactured in the same way as Embodiment Example 2 except that the green compact was sintered in an Ar gas atmosphere.

TABLE 6

Relative Densities and Magnetostriction values of Sintered Compacts

| Sample No. Atmosphere | Process Step | Rel. Density of Sintered Compact (%) | Magnetostriction value (Δl/l ppm) |
|---|---|---|---|
| Embodiment Ex. 2 Vacuum Sintering | After Sintering | 88.7 | 1001 |
| | After HIP Treatment | 99.1 | 890 |
| | After Annealing | 99.1 | 1012 |
| Embodiment Ex. 5 Sintering in Ar Atmosphere | After Sintering | 89.1 | 1130 |
| | After HIP Treatment | 98.3 | 871 |
| | After Annealing | 93.5 | 1073 |

Figure 16:
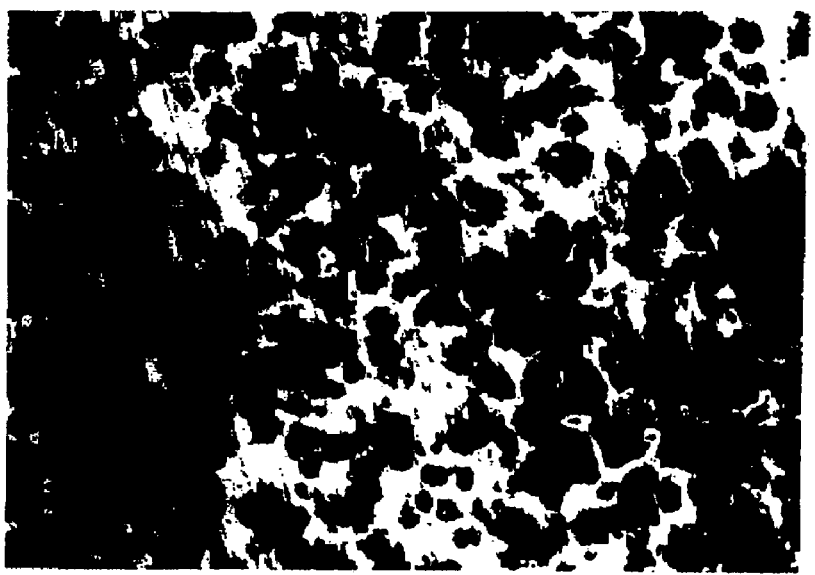
FIGS. 16(a), 16(b) and 16(c) show photographs of closed pores formed when sintering, HIP and annealing treatments are conducted in a vacuum atmosphere, respectively.
Figure 16:
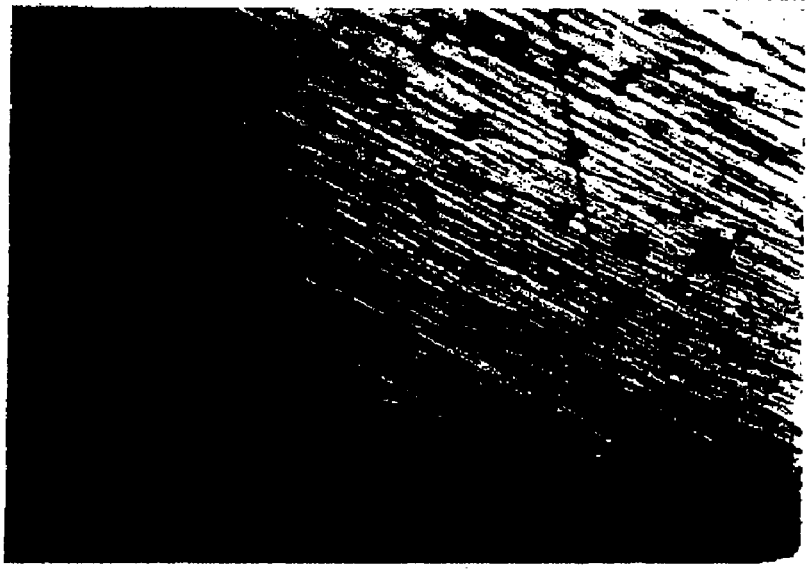
Figure 16:
Figure 17:
FIGS. 17(a), 17(b) and 17(c) show photographs of closed pores formed when sintering, HIP and annealing treatments are conducted in an Ar gas atmosphere, respectively.
Figure 17:
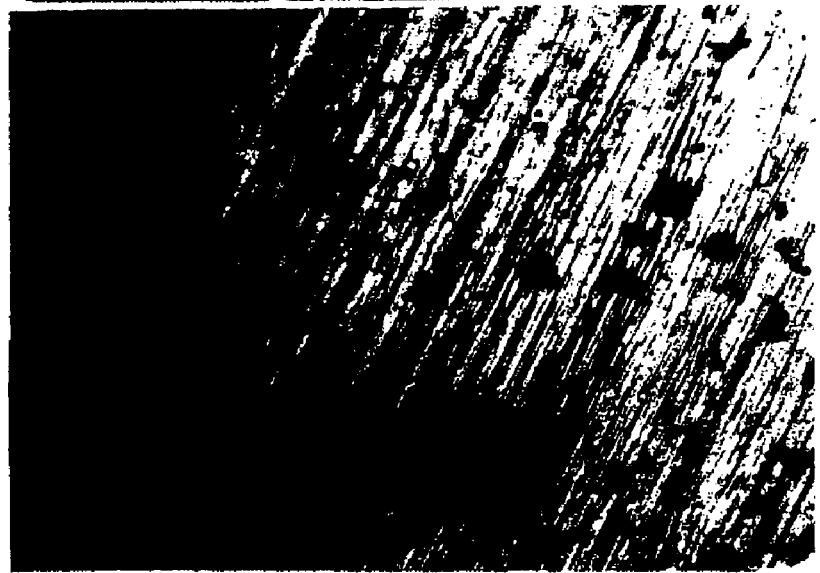
Figure 17:
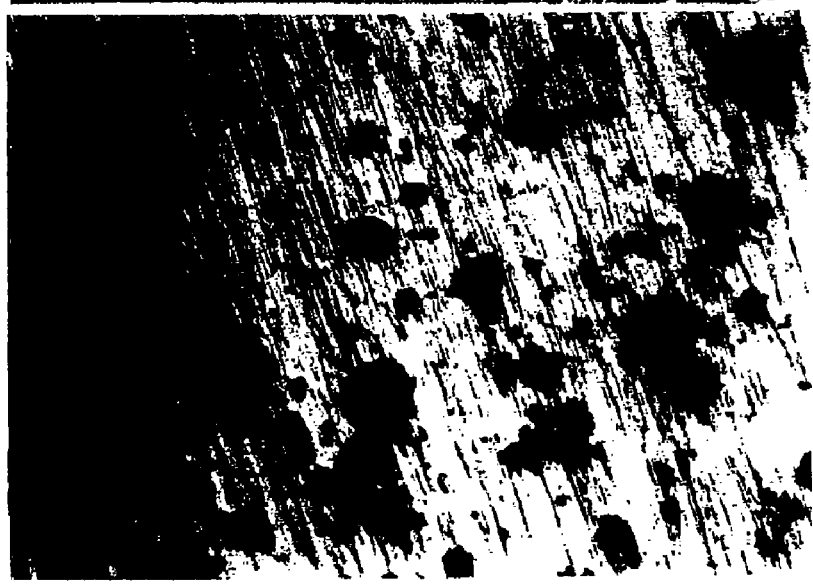
Figure 18:
FIGS. 18(a), 18(b) and 18(c) show photographs of closed pores when sintering, HIP and annealing treatments are conducted in a hydrogen gas atmosphere, respectively.
Figure 18:
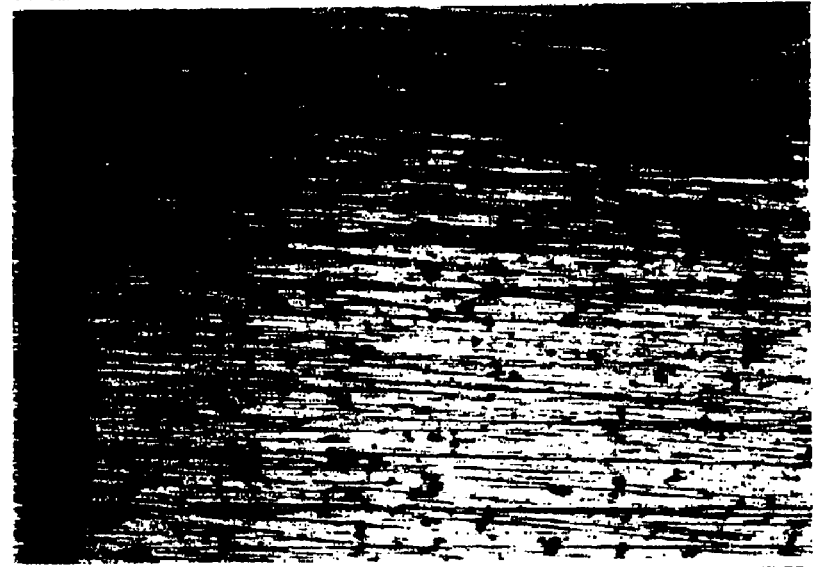
Figure 18:
Figure 19:
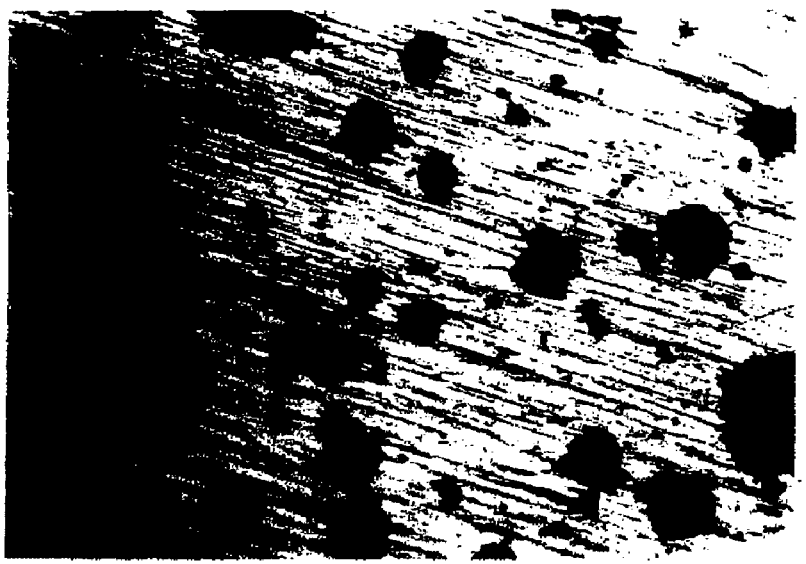
FIGS. 19(a), 19(b) and 19(c) show photographs of closed pores formed when sintering, HIP and annealing treatments are conducted in a mixed gas atmosphere of hydrogen:Ar=65:35, respectively.
Figure 19:
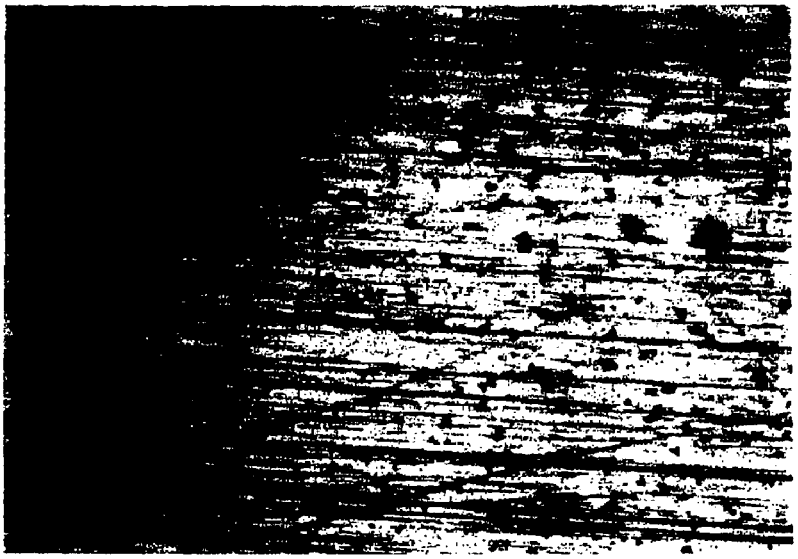
Figure 19:
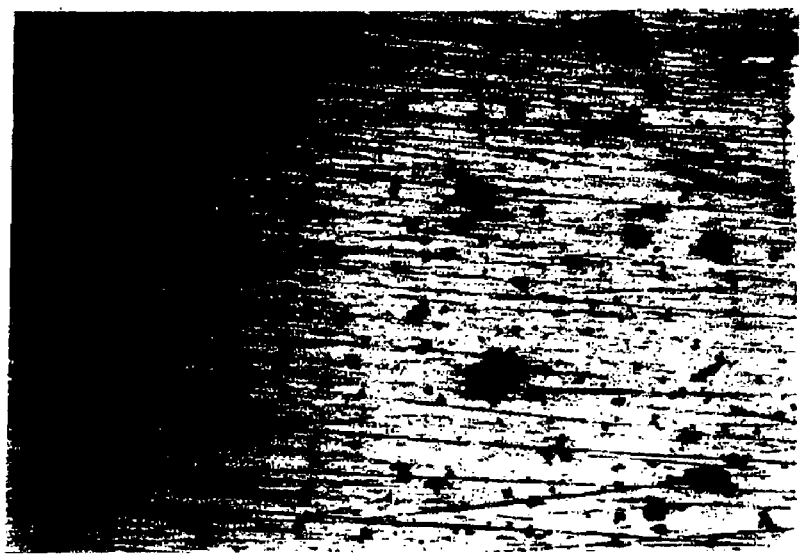
Figure 20:
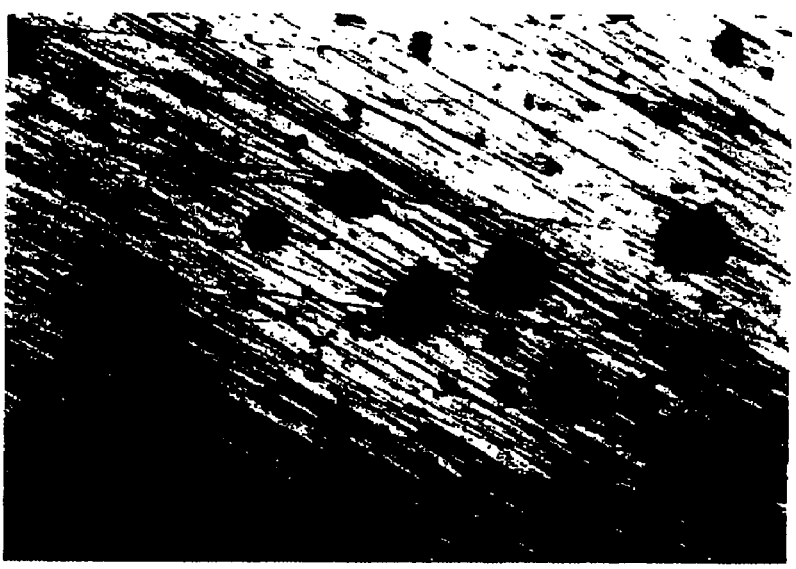
FIGS. 20(a), 20(b) and 20(c) show photographs of closed pores formed when sintering, HIP and annealing treatments are conducted in a mixed gas atmosphere of hydrogen:Ar=50:50, respectively.
Figure 20:
Figure 20:
Figure 21:
FIGS. 21(a), 21(b) and 21(c) show photographs of closed pores when sintering, HIP and annealing treatments are conducted in a mixed gas atmosphere of hydrogen:Ar=35:65, respectively.
Figure 21:
Figure 21:

FIGS. 16 and 17 are photographs of interiors of sintered compacts in Embodiment Example 2 and Comparative Example 5, respectively, seen through a microscope and photographed. FIGS. 16(a) and 17(a) are photographs of the interiors of sintered compacts after sintering, FIGS. 16(b) and 17(b) are photographs of the interiors of sintered compacts after HIP treatment, and FIG. 16(c) and 17(c) are photographs of the interiors of sintered compacts after annealing.

Table 6 shows that densities of the sintered compacts in Embodiment Example 2 and Comparative Example 5 are virtually the same. We can see this also by comparing FIG. 16(a) and FIG. 17(a), which show that black pore parts are equivalent and numerous.

However, in Embodiment Example 2, the density of the sintered compact increased after the HIP treatment and also after annealing, both of which followed sintering, and the value is 99.1% for both, which is higher than 98%. This can be observed on the FIG. 16(b) and FIG. 16(c), which show that there are hardly any black pore parts. Further, since the magnetostriction value after annealing is higher than the magnetostriction value after the HIP treatment, we can see that there is little internal strain.

In Embodiment Example 2, the sintered compact after sintering in some cases showed a significant drop in the magnetostriction value after a long-term use due to the high number of pores, and cracks sometimes appeared as a result of repeated occurrences of internal stress due to repeated use.

Comparative Example 5's relative density is over 98% at 98.3% after the HIP treatment following sintering, but its magnetostriction value is nearly 20 ppm lower than that of Embodiment Example 2. Further, Comparative Example 5's magnetostriction value is high but its density is a low 93.5% after annealing, and numerous cracks appeared after annealing. This can be observed on FIG. 17(b) and FIG. 17(c): although there are hardly any pore parts after the HIP treatment, residual Ar gas inside closed pores expanded during annealing and the closed pores have grown larger. This is thought to have led to larger internal strain, which then led to cracks. In Comparative Example 5 the sintered compact after sintering showed a drastic fall in the magnetostriction value after a long-term use, due to the high number of pores.

From the above, we can see that high density and magnetostriction value can be obtained for the sintered compact by sintering in vacuum and through subsequent HIP treatment and/or annealing.

EMBODIMENTS EXAMPLES 3 AND 4

Sintered compacts in Embodiment Examples 3 and 4 were manufactured in the same way as Embodiment Example 2, except that sintering was conducted in a mixed gas atmosphere of hydrogen:Ar=100:0 for Embodiment Example 3 and in a mixed gas atmosphere of hydrogen:Ar=65:35 for Embodiment Example 4.

COMPARATIVE EXAMPLES 6 AND 7

Sintered compacts in Comparative Examples 6 and 7 were manufactured in the same way as the embodiment 2, except that sintering was conducted in a mixed gas atmosphere of hydrogen:Ar=50:50 for Comparative Example 6 and in a mixed gas atmosphere of hydrogen:Ar=35:65 for Comparative Example 7.

Relative densities and magnetostriction values of sintered compacts of magnetostrictive materials manufactured thus are shown in Table 7.

TABLE 7

Relative Densities and Magnetostriction values of Sintered Compacts

| Sample No. Atmosphere | Process Step | Rel. Density of Sintered Compact (%) | Magnetostriction value ($\Delta l/l$ ppm) |
|---|---|---|---|
| Embodiment Ex. 3 Hydrogen:Ar = 100:0 | After Sintering | 96.8 | 968 |
| | After HIP Treatment | 99.1 | 830 |
| | After Annealing | 99.2 | 963 |
| Embodiment Ex. 4 Hydrogen:Ar = 65:35 | After Sintering | 97.1 | 1020 |
| | After HIP Treatment | 99.4 | 954 |
| | After Annealing | 98.7 | 1001 |
| Comparative Ex. 6 Hydrogen:Ar = 50:50 | After Sintering | 96.5 | 1008 |
| | After HIP Treatment | 98.7 | 813 |
| | After Annealing | 96.8 | 967 |
| Comparative Ex. 7 Hydrogen:Ar = 35:65 | After Sintering | 95.6 | 1050 |
| | After HIP Treatment | 98.4 | 897 |
| | After Annealing | 95.7 | 1033 |

FIGS. 18, 19, 20 and 21 are interiors of sintered compacts of Embodiment Example 3, Embodiment Example 4, Comparative Example 6 and Comparative Example 7, respectively, seen through a microscope and photographed. FIGS. 18(a), 19(a), 20(a) and 21(a) are photographs of interiors of the sintered compacts after sintering, FIGS. 18(b), 19(b), 20(b) and 21(b) are photographs of interiors of the sintered compacts after HIP treatment, and FIGS. 18(c), 19(c), 20(c) and 21(c) are interiors of sintered compacts after annealing.

We can see from Table 7 that in Embodiment Example 3, the densities of the sintered compact after HIP treatment and after annealing are virtually the same and that most of the residual hydrogen in pores had dissipated. This is obvious also by comparing photographs in FIG. 18(b) and FIG. 18(c), which show that the proportions of pores are nearly the same in the two photographs. In Embodiment Example 4, Ar gas constitutes 35% of the atmosphere, and this causes the density of the sintered compact after annealing to be 98.7%, which is slightly lower than the 99.4% after the HIP treatment. This is a result of residual Ar gas that could not dissipate and that expanded. However, the magnetostriction value is larger after annealing since annealing removed residual strains.

In Comparative Examples 6 and 7, we can see that although their magnetostriction values after annealing are larger than after the HIP treatment, their densities of the sintered compacts are clearly lower after annealing than after the HIP treatment due to the impact of the residual Ar gas. In Comparative Example 6, the sintered compact after sintering showed a significant drop in the magnetostriction value after a long-term use and cracks appeared while it was being used as a magnetostrictor. Comparative Example 7 showed numerous cracks after annealing.

EMBODIMENT EXAMPLE 5

For a raw material A, Tb, Dy and Fe were weighed out, fused in an inert atmosphere of Ar gas, and an alloy having the composition $Tb_{0.4}Dy_{0.6}Fe_{1.93}$ was made. The alloy was heat treated for annealing, the concentration distribution of each of the metal elements when making the alloy was made uniform, and the heterogeneous phases that precipitated were eliminated. Next, the raw material A was ground.

For a raw material B, Dy and Fe were weighed out and fused in an inert atmosphere of Ar gas, and an alloy having the composition $Dy_{2.0}Fe_{1.0}$ was made. Next, the alloy was ground. After that, the raw material B was held in a mixed atmosphere of hydrogen and Ar gases and hydrogen absorption-treated.

For a raw material C, Fe that was reduction-treated to remove oxygen in a hydrogen gas atmosphere was used.

Next, the raw materials A, B and C were weighed out separately and mixed and ground. An atomizer (by Tokyo Atomizer Manufacturing Co., Ltd.) was used for grinding.

Following this, the mixture was compacted in a magnetic field. The compaction was performed under the following conditions against a $12 \times 12 \times 16$ mm$^3$ sample in the shape of a square pillar: the direction of the magnetic field was parallel to the axial direction, the magnetic field to be applied was $72 \times 10^4$ A/m, and the compaction pressure was $8640 \times 10^4$ Pa to form a green compact. The green compact was sintered in an Ar atmosphere and a magnetostrictive material was obtained.

The magnetostriction value was measured by applying a magnetic field of $8.0 \times 10^4$ A/m to the magnetostrictive material and measuring the resulting strain with a strain gauge.

COMPARATIVE EXAMPLE 8

In Comparative Example 8, the magnetostrictive material was manufactured in the same way as Embodiment Example 5, except that after the raw materials A, B and C were mixed and ground, they were compacted without having any magnetic fields applied to them.

Table 8 shows the strengths of magnetic fields applied, the degrees of orientation after sintering, and the magnetostriction values.

TABLE 8

Strengths of Magnetic Fields Applied, Degrees of Orientation after Sintering, and Magnetostriction values

| Embodiment No. Comparative Ex. No. | Magnetic Field Applied ($10^4$ A/m) | Degree of Orientation | Magnetostriction value $\lambda_{1.0}$ (ppm) |
|---|---|---|---|
| Embodiment 5 | 24 | 4.0 | 800.0 |
| Comparative Ex. 8 | 0 | 1.0 | 600.0 |

As Table 8 makes clear, Comparative Example 8 that did not have any magnetic fields applied to it has a low degree of orientation and low magnetostriction value $\lambda_{1.0}$. From this, we can see that mixing and grinding the raw materials A, B and C and applying a magnetic field lead to a higher degree of orientation and a higher magnetostriction value $\lambda_{1.0}$ for magnetostrictive material. In addition, we can see that when the degree of orientation is 4.0, which is higher than 2.0, a magnetostriction value $\lambda_{1.0}$ of 800 ppm, which is higher than 700 ppm, can be obtained.

EMBODIMENT EXAMPLES 6-8 AND COMPARATIVE EXAMPLE 9

Embodiment Examples 6-8 and Comparative Example 9 were manufactured in the same way as Embodiment Example 5, except that the strength of the magnetic field applied when compacting in the magnetic field was varied.

Table 9 shows the strength of magnetic field applied, the degree of orientation after sintering, and the magnetostriction value for each.

TABLE 9

Strengths of Magnetic Fields Applied, Degrees of Orientation after Sintering, and Magnetostriction values

| Embodiment Ex. No. Comparative Ex. No. | Magnetic Field Applied ($10^4$ A/m) | Degree of Orientation | Magnetostriction value $\lambda_{1.0}$ (ppm) |
|---|---|---|---|
| Embodiment Ex. 5 | 24 | 4.0 | 800.0 |
| Embodiment Ex. 6 | 48 | 10.0 | 950.0 |
| Embodiment Ex. 7 | 64 | 13.0 | 1050.0 |
| Embodiment Ex. 8 | 80 | 20.0 | 1220.0 |
| Comparison Ex. 9 | 16 | 1.9 | 650.0 |

As Table 9 clearly shows, the magnetic field applied causes the degree of orientation to change; in Comparative Example 9 the magnetostriction value $\lambda_{1.0}$ is 650 ppm when the degree of orientation is 1.9, and in order to obtain a magnetostriction value $\lambda_{1.0}$ of 700 ppm or more, the degree of orientation must be higher than that. Further, as we can see from Embodiment Examples 6-8, when the degree of orientation is 7.0 or more the magnetostriction value $\lambda_{1.0}$ of 900 ppm can be obtained.

EMBODIMENT EXAMPLE 9

For a raw material A, Tb, Dy and Fe were weighed out and fused in an inert atmosphere of Ar gas to make an alloy $Tb_{0.4}Dy_{0.6}Fe_{1.93}$. Next, the alloy was annealed and ground. First, it was coarsely ground with a jaw crusher, then finely ground with a Brown mill until the average particle size was 100-1500 µm.

For a raw material B, Dy and Fe were weighed out and fused in an inert atmosphere of Ar gas to make an alloy $Dy_{2.0}Fe_{1.0}$. The alloy was ground with a jaw crusher until the average particle size was 2-10 mm. Next, the ground particles were held in a mixed atmosphere of hydrogen and Ar gases and hydrogen absorption-treated.

For a raw material C, reduced iron with average particle size of approximately 5 µm was used. The reduced iron was held for approximately 30 minutes at approximately 200° C. in a hydrogen gas atmosphere for a reduction treatment to remove oxygen.

Next, the raw materials A, B and C were weighed out to result with the composition $Tb_{0.3}Dy_{0.7}Fe_{1.88}$. These were mixed, then a grinding machine was used to further grind and mix them. Here, an atomizer (by Tokyo Atomizer Manufacturing Co., Ltd.) was used as the grinding machine to grind until the average particle size was approximately 15 µm.

Thereafter, the mixture was compacted in a magnetic field of $80\times10^4$ (A/m) in parallel direction and under a pressure of $59\times10^7$ Pa to form a green compact.

Next, the green compact was sintered in an Ar gas atmosphere and a magnetostrictive material was manufactured. The heat treatment conditions for sintering were the following: raise the temperature to 940° C. at the rate of 5° C./min. and hold for one hour; and once the green compact's temperature became uniform, the temperature was raised to 1235° C. and held there for three hours; the sintering was completed and a magnetostrictive material was obtained.

Figure 22:
FIG. 22 is an SEM photograph in cross section of a magnetostrictive material obtained from Embodiment Example 9.

An SEM photograph of the magnetostrictive material obtained in Embodiment Example 9 is shown on FIG. 22. When a chemical composition analysis was performed using an energy dispersion x-ray spectrometer (EDS) on each of the phases found in the cross-section, phases indicated by 1 and 2 were found to be the main phase having the composition (Tb, Dy) $Fe_2$. The phase indicated by 3 was found to be a phase whose primary components are Tb and Dy.

Next, we looked for the ratio ([R]/[$RT_2$]) of the phase whose primary components are Tb and Dy to the main phase based on the area of each of the phases, and found the ratio to be 0.0015. When the magnetostriction value of this magnetostrictive material in a magnetic field of $8\times10^4$ A/m was measured, the value was a high 1200 ppm.

EMBODIMENT EXAMPLE 10

Except that raw materials A, B and C were weighed out to result with the composition $Tb_{0.3}Dy_{0.7}Fe_{1.92}$, the mixture was compacted in a magnetic field and sintered in the same way as Embodiment Example 9 to obtain a magnetostrictive material.

Figure 23:
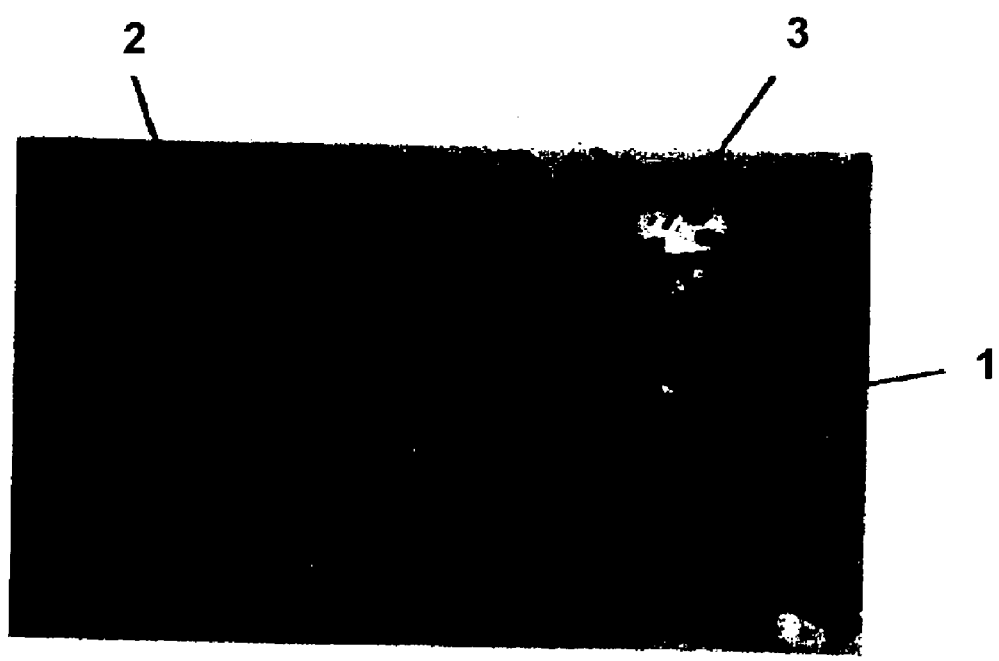
FIG. 23 is an SEM photograph in cross section of a magnetostrictive material obtained from Embodiment Example 10.

An SEM photograph of the cross-section of the magnetostrictive material obtained is shown on FIG. 23. When a chemical composition analysis was performed using an EDS on each of the phases found in the cross-section, the phases indicated by 1 and 2 were found to be the main phase having the composition (Tb, Dy) $Fe_2$. The phase indicated by 3 was found to be a phase whose primary components are Tb and Dy.

Next, we looked for the ratio ([R]/[$RT_2$]) of the phase whose primary components are Tb and Dy to the main phase based on the area of each of the phases, and found the ratio to be 0.0072. When the magnetostriction value of this magnetostrictive material in a magnetic field of 8×10⁴ A/m was measured, the value was a high 1030 ppm.

INDUSTRIAL APPLICABILITY

By using the methods for manufacturing sintered compacts according to the present invention, fine sintered compacts with high density can be obtained. Further, by reducing the oxide content during the manufacture of sintered compact and thereby having closed pores with small internal pressure, a sintered compact with little internal strain can be manufactured. Moreover, by applying the methods for manufacturing sintered compacts according to the present invention to the manufacture of magnetostrictive material, a magnetostrictive material with a large magnetostriction value, small reduction in magnetostriction value over time, and without cracks can be obtained.

In addition, by increasing the degree of orientation in the [111] axis direction, which is an easy axis of magnetization and has large magnetostrictive constant, a magnetostrictive material with high magnetostriction value can result. And by stipulating the ratio of phases whose primary components are R to the main phase RT2, a superior magnetostrictive material with no fluctuations in properties among products can be provided.

The invention claimed is:

1. A magnetostrictive material:
formed by compaction in a magnetic field and then sintering a mixture containing a material A that is represented by Expression 7: $(Tb_xDy_{1-x})T_yTy$ (where, x and y atom ratios wherein x and y are in ranges of $0.35 < x < 0.50$ and $1.50 < y < 2.30$, respectively), a material B that is represented by Expression 8: $Dy_tT_{1-t}$ (where, Dy include at least one of Tb and Ho, and t is an atom ratio in range of $0.37 < t < 1.00$) and that contains hydrogen in the amount from 7000 ppm to 22000 ppm, and a material C containing T, and wherein
the magnetostrictive material comprises:
$RT_w$ (where, R is at least one kind of rare earth metal, T is at least one kind of transition metal, and w is $1.50 \leq w \leq 2.30$); and
a degree of orientation greater or equal to 2;
wherein the degree of orientation is $$\frac{I(222)(//)/I(311)(//)}{I(222)(\perp)/I(311)(\perp)}$$

(where, each of the I (222) and I (311) represents an x-ray diffraction intensity on a (222) plane and a (311) plane, respectively, and (//) and ($\perp$) represent measurements taken on a plane parallel and on a plane vertical, respectively, to a magnetic field orientation in the compaction in the magnetic field).

2. A magnetostrictive material according to claim 1, wherein the degree of orientation of the magnetostrictive material in which the [111] axis orients in a direction in parallel with the magnetic field has a value of 7.0 or greater given the degree of orientation.

3. A magnetostrictive material:
formed by compaction in a magnetic field and then sintering a mixture containing a material A that is represented by Expression 7: $(Tb_xDy_{1-x})T_yTy$ (where, x and y are atom ratios wherein x and y are in ranges of $0.35 < x < 0.50$ and $1.50 < y < 2.30$, respectively), a material B that is represented by Expression 8: $Dy_tT_{1-t}$ (where, Dy include at least one of Tb and Ho, and t is an atom ratio in range of $0.37 < t < 1.00$) and that contains hydrogen in the amount from 7000 ppm to 22000 ppm, and a material C containing T, and wherein
the magnetostrictive material comprises:
$RT_w$ (where, R is at least one kind of rare earth metal, T is at least one kind of transition metal, and w is $1.50 \leq w \leq 2.30$);
a structure composed of a $RT_2$ main phase and at least one kind of heterogeneous phase including a phase having R as a main composition;
wherein a ratio of the phase having R as a main composition among the heterogeneous phase to the $RT_2$ main phase $[R]/[RT2]$ is in a range of $0 < [R]/[RT2] \leq 0.45$.

4. A magnetostrictive material according to any one of claims 1 through 3, wherein the magnetostrictive material is represented by Expression 6: $(Tb_xDy_{1-x})T_wT_w$ (where, v and w are atom ratios wherein v and w are in ranges of $0.27 \leq v \leq 0.50$ and $1.50 \leq w \leq 2.30$, respectively).

5. A magnetostrictive material according to any one of claims 2 or 3, wherein T in the magnetostrictive material is at least one kind of metal selected from Fe, Ni and Co.

6. A magnetostrictive material according to claim 4 wherein T in the magnetostrictive material is at least one kind of metal selected from Fe, Ni and Co.

7. A magnetostrictive material, according to claim 4 wherein the magnetostrictive material is formed by compacting in a magnetic field and then sintering a mixture containing a material A that is represented by Expression 7: $(Tb_xDy_{1-x})T_yTy$ (where, x and y are atom ratios wherein x and y are in ranges of $0.35 < x \leq 0.50$ and $1.50 \leq y \leq 2.30$, respectively), a material B that is represented by Expression 8: $Dy_tT_{1-t}$ (where, Dy includes at least one of Tb and Ho, and t is an atom ratio in a rage of $0.37 \leq t \leq 1.00$), and a material C containing T.

8. A magnetostrictive material according to claim 5, wherein the magnetostrictive material is formed by compacting in a magnetic field and then sintering a mixture containing a material A that is represented by Expression 7: $(Tb_xDy_{1-x})T_y$ (where, x and 7 are atom ratios wherein x and y are in ranges of $0.35 < x \leq 0.50$ and $1.50 \leq y \leq 2.30$, respectively), a material B that is represented by Expression 8: $Dy_tT_{1-t}$ (where, Dy includes at least one of Tb and Ho, and t is an atom ratio in a rage of $0.37 \leq t \leq 1.00$), and a material C containing T.

9. A magnetostrictive material according to claim 6, wherein the magnetostrictive material is formed by compacting in a magnetic field and then sintering a mixture containing a material A that is represented by Expression 7: $(Tb_xDy_{1-x})T_yTy$ (where, x and y are atom ratios wherein x and y are in ranges of $0.35 < x \leq 0.50$ and $1.50 \leq y \leq 2.30$, respectively), a material B that is represented by Expression 8: $Dy_tT_{1-t}$ (where, Dy includes at least one of Tb and Ho, and t is an atom ratio in a range of $0.37 \leq t \leq 1.00$), and a material C containing T.

10. A magnetostrictive material according to claim 7, wherein the material B represented by Expression 8 in the magnetostrictive material contains hydrogen in the amount from 7000 ppm to 22000 ppm.

11. A magnetostrictive material according to claim 8, wherein the material B represented by Expression 8 in the magnetostrictive material contains hydrogen in the amount from 7000 ppm to 22000 ppm.

12. A magnetostrictive material according to claim 9, wherein the material B represented by Expression 8 in the magnetostrictive material contains hydrogen in the amount of 7000 ppm or greater but 22000 ppm or lower.

13. The method of manufacturing a magnetostrictive material comprises, compacting in a magnetic field and then sintering a mixture containing a material A that is represented by Expression 7: $(Tb_xDy_{1-x})T_yTy$ (where, x and y are atom ratios wherein x and y are in ranges of $0.35 < x < 0.50$ and $1.50 < y < 2.30$, respectively), a material B that is represented by Expression 8: $Dy_tT_{1-t}$ (where, Dy include at least one of Tb and Ho, and t is an atom ratio in range of $0.37 < t < 1.00$) and that contains hydrogen in the amount from 7000 ppm to 22000 ppm, and a material C containing T.

* * * * *